US010833169B1

(12) United States Patent
Chu et al.

(10) Patent No.: US 10,833,169 B1
(45) Date of Patent: Nov. 10, 2020

(54) METAL GATE FOR A FIELD EFFECT TRANSISTOR AND METHOD

(71) Applicant: GLOBALFOUNDRIES INC., Grand Cayman (KY)

(72) Inventors: Tao Chu, Clifton Park, NY (US); Rongtao Lu, Rexford, NY (US); Ayse M. Ozbek, Malta, NY (US); Wei Ma, Clifton Park, NY (US); Haiting Wang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/390,473

(22) Filed: Apr. 22, 2019

(51) Int. Cl.
| | |
|---|---|
| *H01L 29/66* | (2006.01) |
| *H01L 29/423* | (2006.01) |
| *H01L 29/78* | (2006.01) |
| *H01L 29/40* | (2006.01) |
| *H01L 21/311* | (2006.01) |

(Continued)

(52) U.S. Cl.
CPC .. *H01L 29/66545* (2013.01); *H01L 21/31055* (2013.01); *H01L 21/31116* (2013.01); *H01L 21/3213* (2013.01); *H01L 21/32055* (2013.01); *H01L 29/401* (2013.01); *H01L 29/42364* (2013.01); *H01L 29/42376* (2013.01); *H01L 29/6653* (2013.01); *H01L 29/66795* (2013.01); *H01L 29/785* (2013.01); *H01L 21/3212* (2013.01)

(58) Field of Classification Search
CPC .................................................. H01L 29/401
See application file for complete search history.

(56) References Cited

U.S. PATENT DOCUMENTS

| | | | |
|---|---|---|---|
| 9,443,771 B1 * | 9/2016 | Shen | ................... H01L 29/4966 |
| 9,865,703 B2 | 1/2018 | Ando et al. | |

(Continued)

FOREIGN PATENT DOCUMENTS

CN 108735672 A 11/2018

OTHER PUBLICATIONS

TechInsights, "Qualcomm Snapdragon 835 MSM8998 Samsung 10LPE FinFET Process," Advanced CMOS Essentials (Part 2 of 2), ACE-704-803, 2017, p. 4 and 18.

*Primary Examiner* — Omar F Mojaddedi
(74) *Attorney, Agent, or Firm* — Gibb & Riley, LLC; Francois Pagette

(57) ABSTRACT

Disclosed is a metal gate (e.g., a replacement metal gate (RMG) for a field effect transistor (FET) and a method of forming the metal gate. The method includes depositing a conformal dielectric layer to line a gate opening and performing a series of unclustered and clustered conformal metal deposition and chamfer processes to selectively adjust the heights of conformal metal layers within the gate opening. By selectively controlling the heights of the conformal metal layers, the method provides improved overall gate height control and gate quality particularly when the metal gate has a small critical dimension (CD) and/or a high aspect ratio (AR). The method can also include using different etch techniques during the different chamfer processes and, particularly, when different materials and/or different material interfaces are exposed to an etchant in order to ensure an essentially uniform etch rate of the conformal metal layer(s) at issue in a direction that is essentially vertical.

17 Claims, 18 Drawing Sheets

(51) Int. Cl.
    *H01L 21/32*         (2006.01)
    *H01L 21/3105*    (2006.01)
    *H01L 21/3205*    (2006.01)
    *H01L 21/3213*    (2006.01)
    *H01L 21/321*     (2006.01)

(56) References Cited

U.S. PATENT DOCUMENTS

| | | |
|---|---|---|
| 10,056,303 B1 | 8/2018 | Patil et al. |
| 10,177,041 B2 | 1/2019 | Xie et al. |
| 2008/0265322 A1 | 10/2008 | Lin et al. |
| 2015/0021694 A1* | 1/2015 | Trevino .............. H01L 29/4966 257/368 |
| 2015/0021704 A1 | 1/2015 | Zang et al. |
| 2016/0042954 A1* | 2/2016 | Sung ................. H01L 29/66545 257/407 |
| 2016/0284817 A1 | 9/2016 | Basker et al. |
| 2016/0380070 A1 | 12/2016 | Basker et al. |
| 2017/0194459 A1* | 7/2017 | Ando ................ H01L 29/42364 |
| 2018/0190546 A1 | 7/2018 | Wu et al. |
| 2018/0323113 A1 | 11/2018 | Patil et al. |

\* cited by examiner

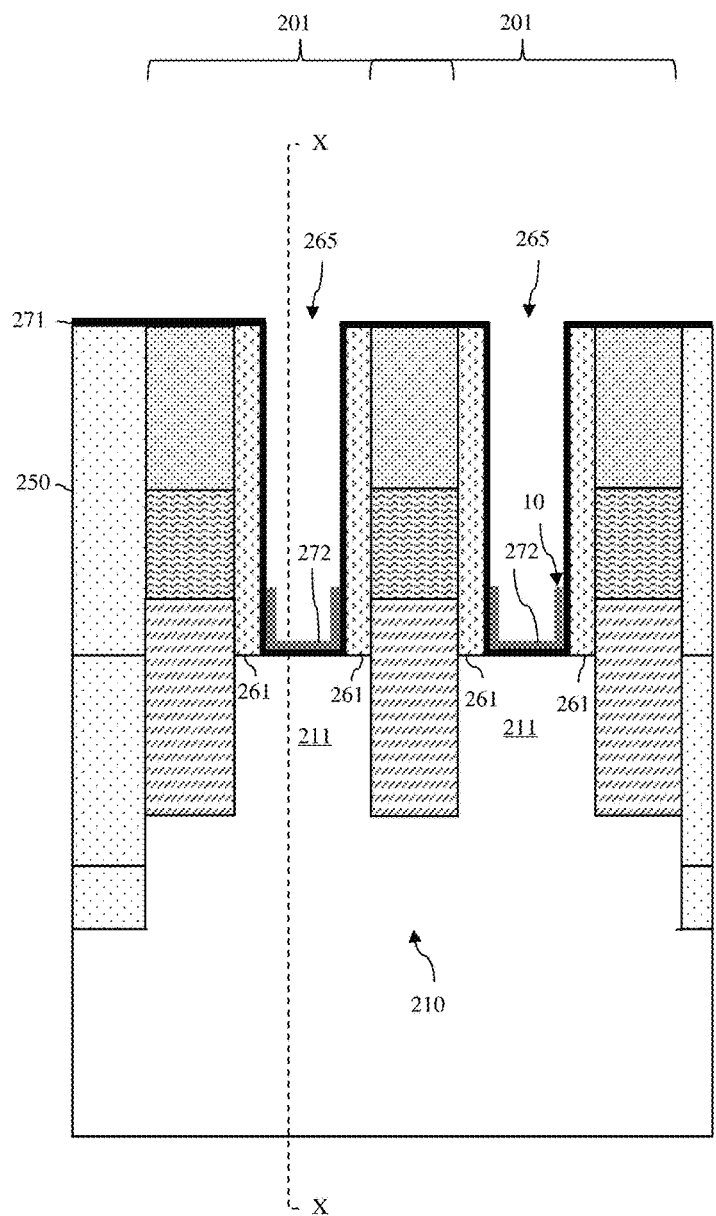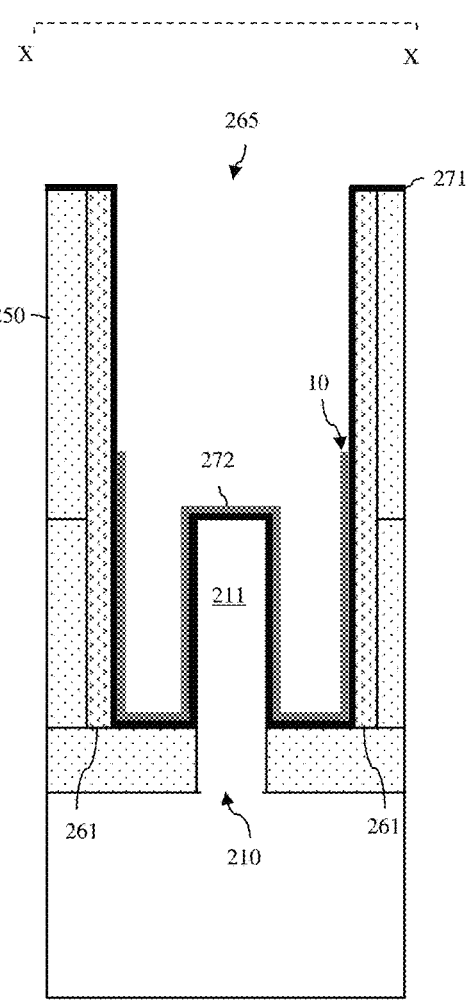
FIG. 7A
FIG. 7B

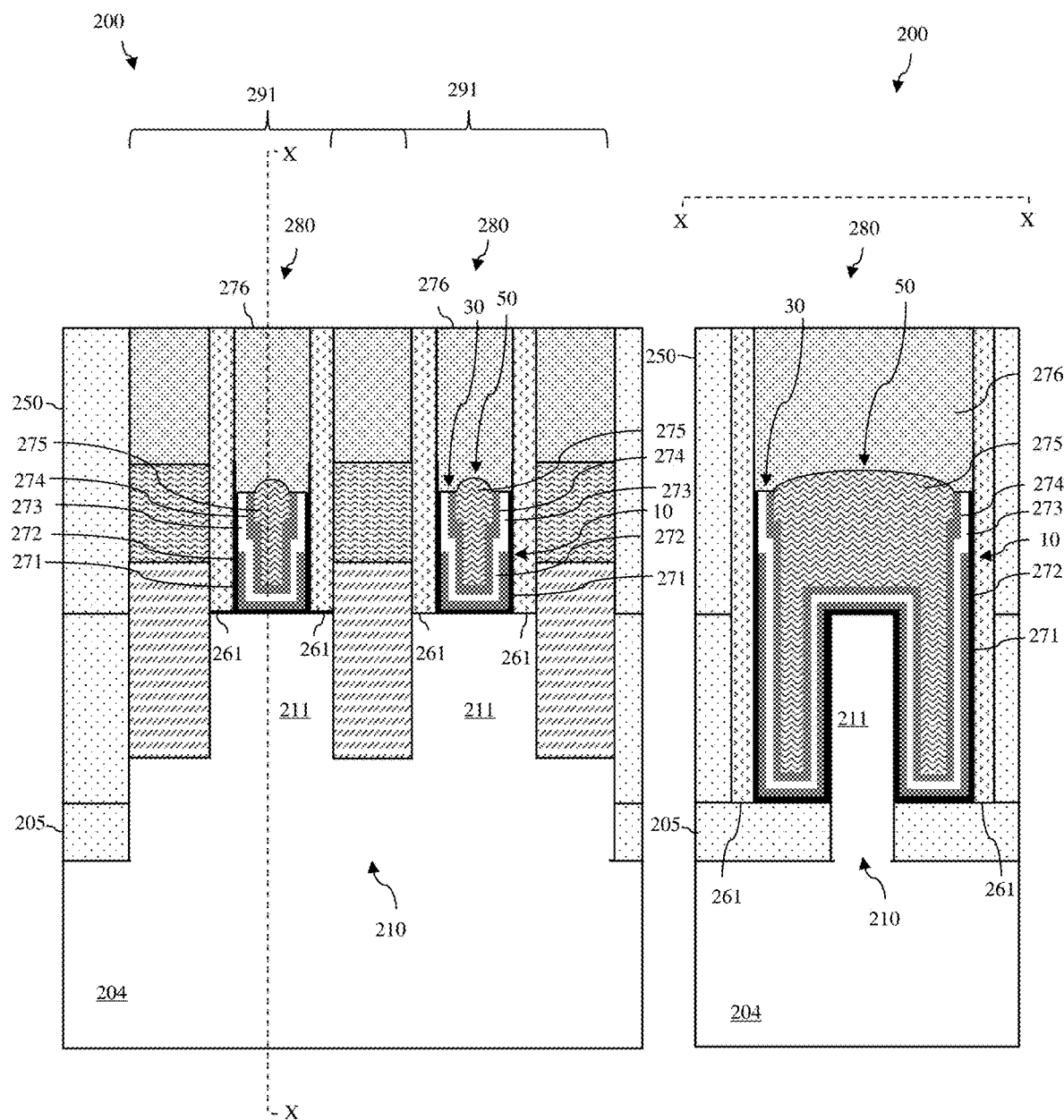

METAL GATE FOR A FIELD EFFECT TRANSISTOR AND METHOD

BACKGROUND

Field of the Invention

The present invention relates to field effect transistors (FETs) and, more particularly, to a metal gate (e.g., a replacement metal gate (RMG)) for a FET and a method for forming the metal gate during FET formation.

Description of Related Art

Integrated circuit (IC) design innovations are often driven by device performance, scalability, and manufacturability. For example, prior to the development of the 45 nm technology node, gate-first processing was used. With the 45 nm technology node came the development of high-K/metal gates to reduce leakage current and increase drive current. Currently, the preferred technique for forming high-K/metal gates is referred to as replacement metal gate processing and the resulting gates are referred to as replacement metal gates (RMGs). RMG processing can include, for example: forming a sacrificial gate structure with gate sidewall spacers on a semiconductor body adjacent to the channel region; forming the source/drain regions, etc.; subsequently removing the sacrificial gate to form a gate opening and forming a RMG in the gate opening. However, with each new technology node, the gate critical dimension (CD) (i.e., the gate length as measured across the channel region from one source/drain region to the other gets gets smaller) is shrinking. Furthermore, with the development of non-planar devices (e.g., fin-type field effect transistors (FINFETs) and gate-all-around field effect transistors (GAAFETs)), gate heights have increased and, thus, so have gate aspect ratios (ARs) (i.e., the ratio of gate length to gate height). These smaller gate CDs and/or the larger gate ARs have made forming quality RMGs more challenging because of problems associated with depositing material into or removing material from a gate opening with a small CD and/or a high AR.

SUMMARY

Disclosed herein are embodiments of a metal gate (e.g., a replacement metal gate (RMG)) for a field effect transistor (FET). The FET can include source/drain regions, a channel region that extends laterally between the source/drain regions, the metal gate adjacent to the channel region, and gate sidewall spacers between the metal gate and the source/drain regions. The metal gate can include a conformal dielectric layer immediately adjacent to the channel region of the FET and further positioned laterally immediately adjacent to vertical surfaces of the sidewall spacers. The metal gate can further include multiple conformal metal layers. These conformal metal layers can include a first conformal metal layer immediately adjacent to the conformal dielectric layer opposite the channel region and further opposite lower portions of the vertical surfaces of the gate sidewall spacers. A top end of the first conformal metal layer can be at some predetermined height above the level of the top surface of the channel region. The conformal metal layers can also include multiple additional conformal metal layers above the first conformal metal layer and further positioned laterally immediately adjacent to the conformal dielectric layer opposite upper portions of the vertical surfaces of the gate sidewall spacers. Top ends of the additional conformal metal layers can at a height above the height of the top end of the first conformal metal layer.

Also disclosed herein are embodiments of a method of forming a metal gate (e.g., a replacement metal gate (RMG)) for a field effect transistor (FET).

A first embodiment of the method can include depositing a conformal dielectric layer so as to line a gate opening, which exposes a channel region of a field effect transistor (FET). The method can further include depositing a first conformal metal layer over the conformal dielectric layer so as to further line the gate opening. Next, a first chamfer process can be performed in order to etch back the first conformal metal layer within the gate opening to a first height above the level of the top surface of the channel region, thereby exposing a portion of the conformal dielectric layer that is above the first height. Additional conformal metal layers can then be deposited over the exposed portion of conformal dielectric layer and over the first conformal metal layer so as to further line the gate opening. Next, a second chamfer process can be performed to etch back the additional conformal metal layers within the gate opening to a second height (which is greater than the first height) above the level of the top surface of the channel region, thereby exposing a portion of the conformal dielectric layer above the second height (i.e., a smaller portion than was exposed after the first chamfer process).

A second embodiment of the method can similarly include depositing a conformal dielectric layer so as to line a gate opening, which exposes a channel region of a field effect transistor (FET). Then, a first conformal metal layer can be deposited over the conformal dielectric layer so as to further line the gate opening and a first chamfer process can be performed in order to etch back the first conformal metal layer within the gate opening to a first height above the level of the top surface of the semiconductor body, thereby exposing a portion of the conformal dielectric layer that is above the first height. In this embodiment, instead of forming the additional conformal metal layers immediately following the first chamfer process, a second conformal metal layer can be deposited over the exposed portion of conformal dielectric layer and over the first conformal metal layer so as to further line the gate opening. A second chamfer process can be performed in order to etch back the second conformal metal layer within the gate opening to a second height (which is greater than the first height) above the level of the top surface of the channel region, thereby exposing an upper portion of the conformal dielectric layer above the second height (i.e., a smaller portion than was exposed after the first chamfer process). After the second chamfer process is performed, additional conformal metal layers can be deposited over the exposed portion of the conformal dielectric layer and over the second conformal metal layer so as to further line the gate opening. Then, a third chamfer process can be performed in order to selectively etch back the additional conformal metal layers within the gate opening to a third height (which is greater than the second height) above the level of the top surface of the channel region, thereby exposing an upper portion of the conformal dielectric layer above the third height (i.e., a smaller upper portion than was exposed after the second chamfer process).

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 11A-11B are cross-section diagrams illustrating an embodiment of a FET having a RMG;

FIGS. 2A-2B to FIGS. 7A-7B and FIGS. 12A-12B to FIGS. 17A-17B are cross-section diagrams illustrating partially completed structures formed according to the flow diagram of FIG. 1 and using optional process flow B.

DETAILED DESCRIPTION

As mentioned above, replacement metal gates (RMGs) can be employed in field effect transistors (FETs) to reduce leakage current and increase drive current. However, with each new technology node, the gate critical dimension (CD) (i.e., the gate length as measured across the channel region from one source/drain region to the other gets smaller) is shrinking. Furthermore, with the development of non-planar devices (e.g., fin-type field effect transistors (FIN-FETs) and gate-all-around field effect transistors (GAAF-ETs)), gate heights have increased and, thus, so have gate aspect ratios (ARs) (i.e., the ratio of gate length to gate height). The smaller gate CDs and/or the larger gate ARs have made forming quality RMGs (i.e., essentially defect-free RMGs with uniform gate heights across a semiconductor wafer) more challenging because of problems associated with depositing material into or removing material from a gate opening with a small CD and/or a high AR. Additionally, adjusting metal layer thicknesses within an RMG in order to fine tune performance parameters (e.g., threshold voltage) can be challenging due to the limited amount of space within the gate opening.

In view of the foregoing, disclosed herein are embodiments of a metal gate (e.g., a replacement metal gate (RMG)) for a field effect transistor (FET) and a method of forming the metal gate. Specifically, the method can include depositing a conformal dielectric layer to line a gate opening and then performing a series of conformal metal deposition and chamfer processes to selectively adjust the heights of the conformal metal layers within the gate opening. By selectively controlling the heights of these metal layers, the method provides improved gate quality and improved gate height control particularly for RMGs having a small critical dimension (CD) (e.g., a gate length of 20 nm or less) and/or a high aspect ratio (AR) (e.g., an AR of 1:4 or higher, such as gate length of 20 nm or less to a gate height of 80 nm or more). The method also, optionally, includes using different etch techniques during the different chamfer processes and, particularly, when different materials are etched in order to ensure a controlled and essentially uniform etch rate in a downward vertical direction.

Figure 1:
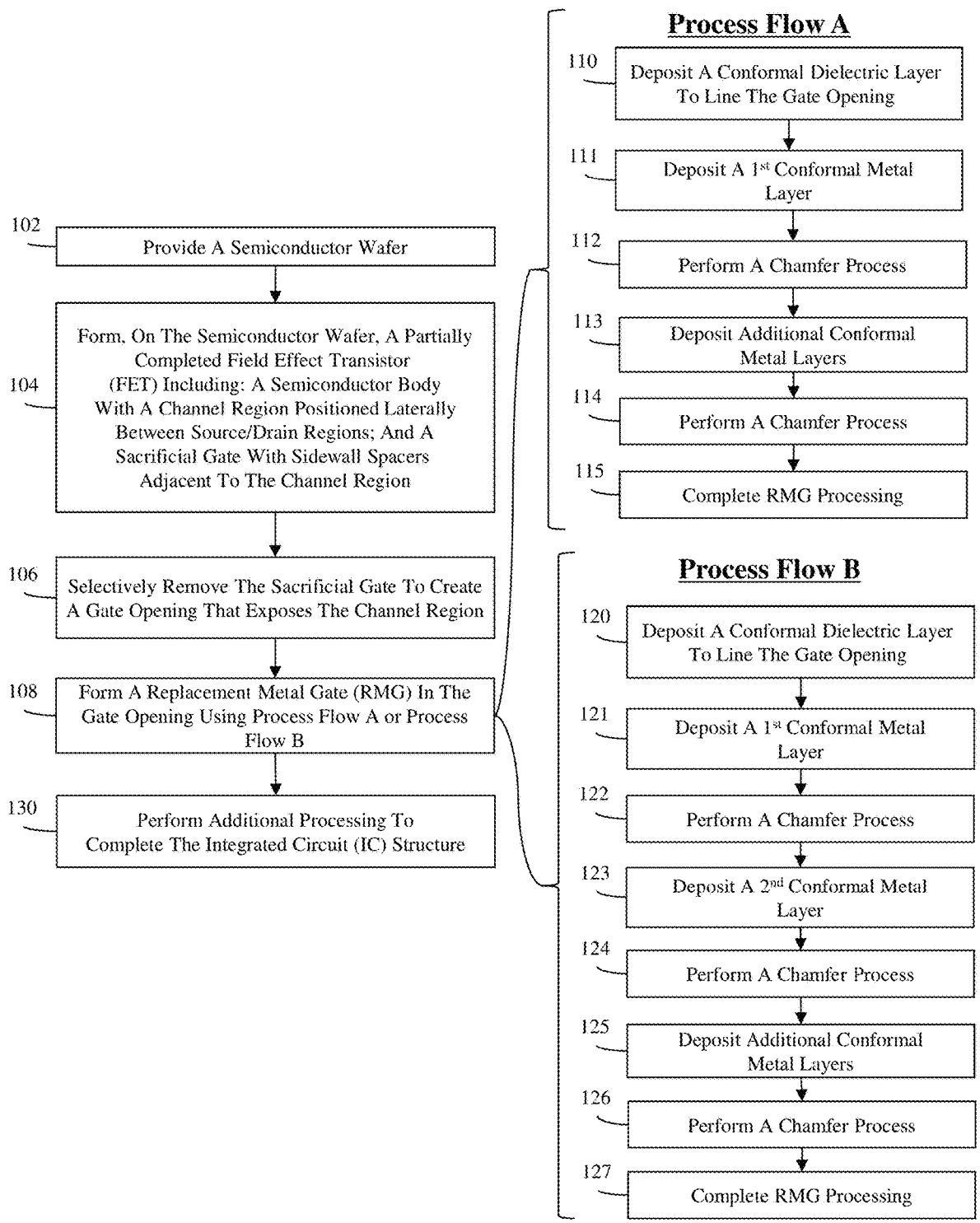
FIG. 1 is a flow diagram illustrating method embodiments for forming a field effect transistor (FET) having a replacement metal gate (RMG)

More particularly, FIG. 1 is a flow diagram illustrating embodiments of a method of forming a replacement metal gate (RMG) during formation of a field effect transistor (FET).

Figures 2A, 2B:
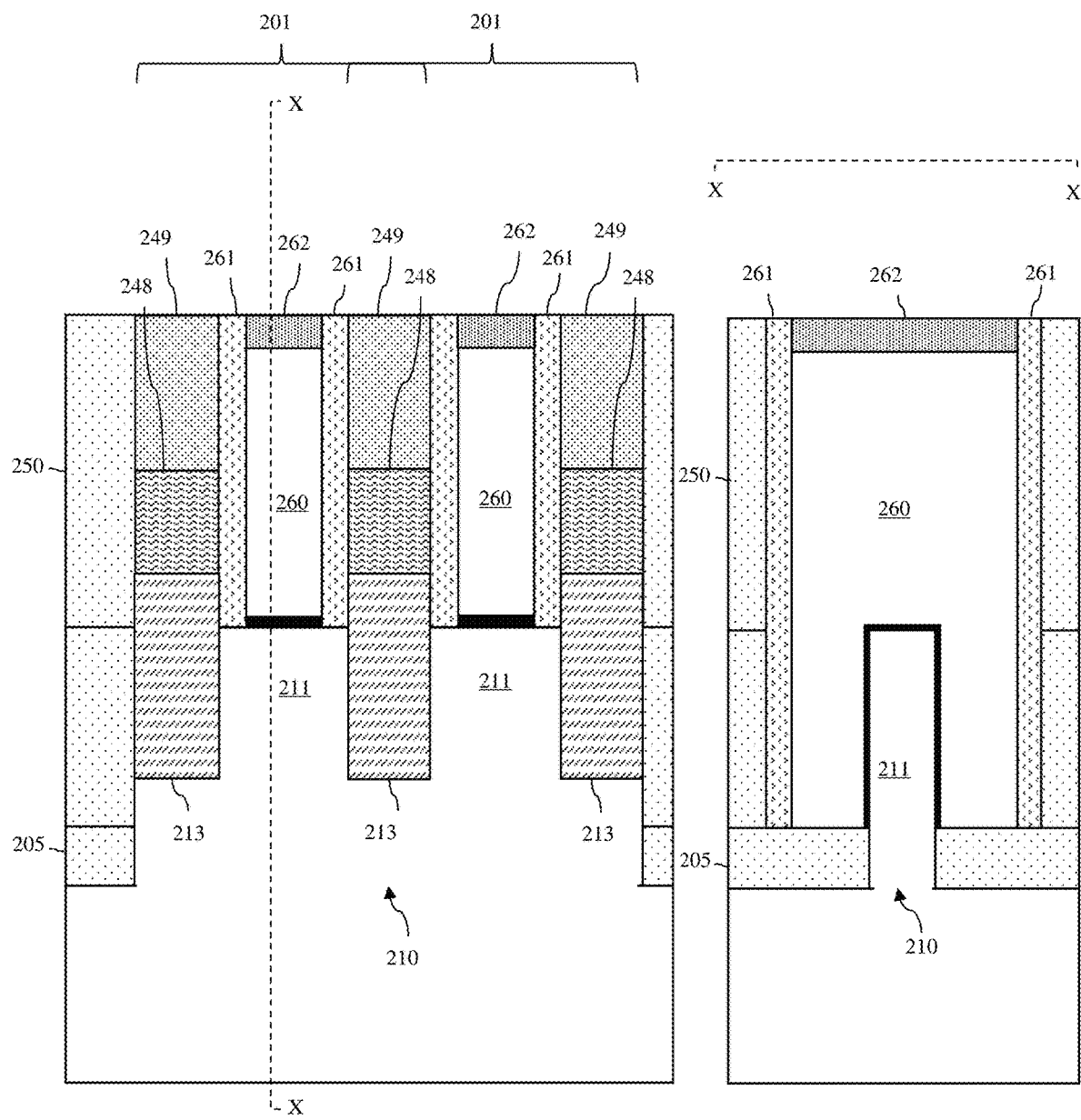
FIGS. 2A-2B to FIGS. 10A-10B are cross-section diagrams illustrating partially completed structures formed according to the flow diagram of FIG. 1 and using optional process flow A.

Each of the method embodiments can include providing a semiconductor wafer 204 and performing front end of the line (FEOL) and some middle of the line (MOL) processing in order to form, on the semiconductor wafer, one or more partially completed FET structures 201 (see process steps 102-104 and FIGS. 2A-2B). The semiconductor wafer 204 can be, for example, a bulk semiconductor wafer (e.g., a bulk silicon wafer or other suitable bulk semiconductor wafer). Alternatively, the semiconductor wafer can be a semiconductor-on-insulator wafer (e.g., a silicon-on-insulator (SOI) wafer), which includes a semiconductor substrate (e.g., a silicon substrate), an insulator layer (e.g., a buried oxide (BOX) layer or other suitable insulator layer) on the semiconductor substrate and a semiconductor layer (e.g., a silicon layer or other suitable semiconductor layer) on the insulator layer.

Each partially completed FET structure 201 can include at least one semiconductor body 210 and a channel region 211, which is within the semiconductor body 210 and which is positioned laterally between source/drain regions 213. Each partially completed FET structure 201 can further include a shallow trench isolation (STI) region 205.

For purposes of illustration, each partially completed FET structure 201 can be a partially completed single-fin fin-type field effect transistor (FINFET) (as illustrated), where the semiconductor body 210 is a semiconductor fin (e.g., a silicon fin), where multiple FINFETs are formed along the same semiconductor fin, where adjacent FINFETs share a source/drain region therebetween, and where the STI region 205 laterally surrounds a lower portion of the semiconductor fin. However, it should be understood that the specification and drawings are not intended to be limiting. Alternatively, each partially completed FET structure 201 can have a different FINFET configuration. For example, each partially completed FET structure 201 could be a multi-fin FINFET with multiple semiconductor bodies (i.e., multiple semiconductor fins) and the lower portion of each fin can be laterally surrounded by STI. Alternatively, each partially completed FET structure 201 could be a partially completed planar FET, where the STI laterally surrounds and defines the shape of a planar semiconductor body. Alternatively, each partially completed FET structure 201 could be a partially completed gate-all-around FET (GAAFET), where, after sacrificial gate removal and before RMG formation, the semiconductor body is processed into nanowire(s) or nanosheet(s) (e.g., silicon nanowire(s) or nanosheet(s)) and where the STI is below the nanowire(s) or nanosheet(s). Thus, it should be understood that each partially completed FET structure 201 could be any suitable partially completed FET structure for which RMG processing can be performed.

In any case, each partially completed FET structure 201 can include a sacrificial gate 260 with a sacrificial gate cap 262. The sacrificial gate 260 can be above and immediately adjacent to the STI region 205 and can further be adjacent to the channel region 211 (e.g., adjacent to the top surface and opposing sides of the semiconductor fin at the channel region 211 in the case of the single-fin FINFET shown). The sacrificial gate 260 can include an optional first sacrificial gate layer adjacent to the channel region 211 and a second sacrificial layer on the first sacrificial gate layer. The first sacrificial gate layer can be, for example, a thin silicon dioxide layer. The second sacrificial gate layer can be, for example, a polysilicon layer, an amorphous silicon layer or any other suitable sacrificial gate material, which is different from the semiconductor body material at the channel region 211 and which can be selectively and isotropically etched away from the semiconductor body at the channel region during subsequent processing. The sacrificial gate cap can be, for example, a silicon nitride cap layer. During processing these layers can be deposited over the channel region 211 and then lithographically patterned and etched to form the sacrificial gate 260 with the sacrificial gate cap 262.

Each partially completed FET structure 201 can further include dielectric gate sidewall spacers 261 positioned laterally adjacent to the sidewalls of the sacrificial gate 260. Specifically, gate sidewall spacers 261 can be positioned laterally adjacent to opposing sidewalls of the sacrificial gate 260 such that they are positioned laterally between the sacrificial gate 260 and the source/drain regions 213 and, thus, such that they traverse the semiconductor body 210 on either side of the channel region 211 (as shown in FIG. 2A). Additional gate sidewall spacers 261 could be positioned laterally adjacent to other sidewalls of the sacrificial gate such that they are parallel to and on either side of the semiconductor body 210 at the channel region 211 (as shown in FIG. 2B). The gate sidewall spacers 261 can be formed using conventional gate sidewall spacer formation techniques. The gate sidewall spacers 261 can, for example, be made of silicon nitride, silicon carbon nitride, silicon boron carbon nitride or any other suitable gate sidewall spacer material that is different from the material used for the sacrificial gate 260.

Each partially completed FET structure 201 can further include, for example: metal plugs 248 on the source/drain regions 213 and dielectric plug caps 249 on the metal plugs 248. Interlayer dielectric (ILD) material 250 can be positioned laterally adjacent to each partially completed FET structure 201. Such features are well known in the art and, thus, the details thereof have been omitted from this specification in order to allow the reader to focus on the salient aspects of the disclosed embodiments. In any case, the top surfaces of the ILD material 250, gate sidewall spacers 261, the dielectric plug caps 249 and the sacrificial gate cap(s) 262 can be essentially co-planar (e.g., due to chemical mechanical polishing (CMP)).

The following process steps are described below with respect to one of the partially completed FET structures (e.g., partially completed FET structure 201). However, it should be understood that these process steps could be performed with respect to each of the partially completed FET structures.

Figures 3A, 3B:
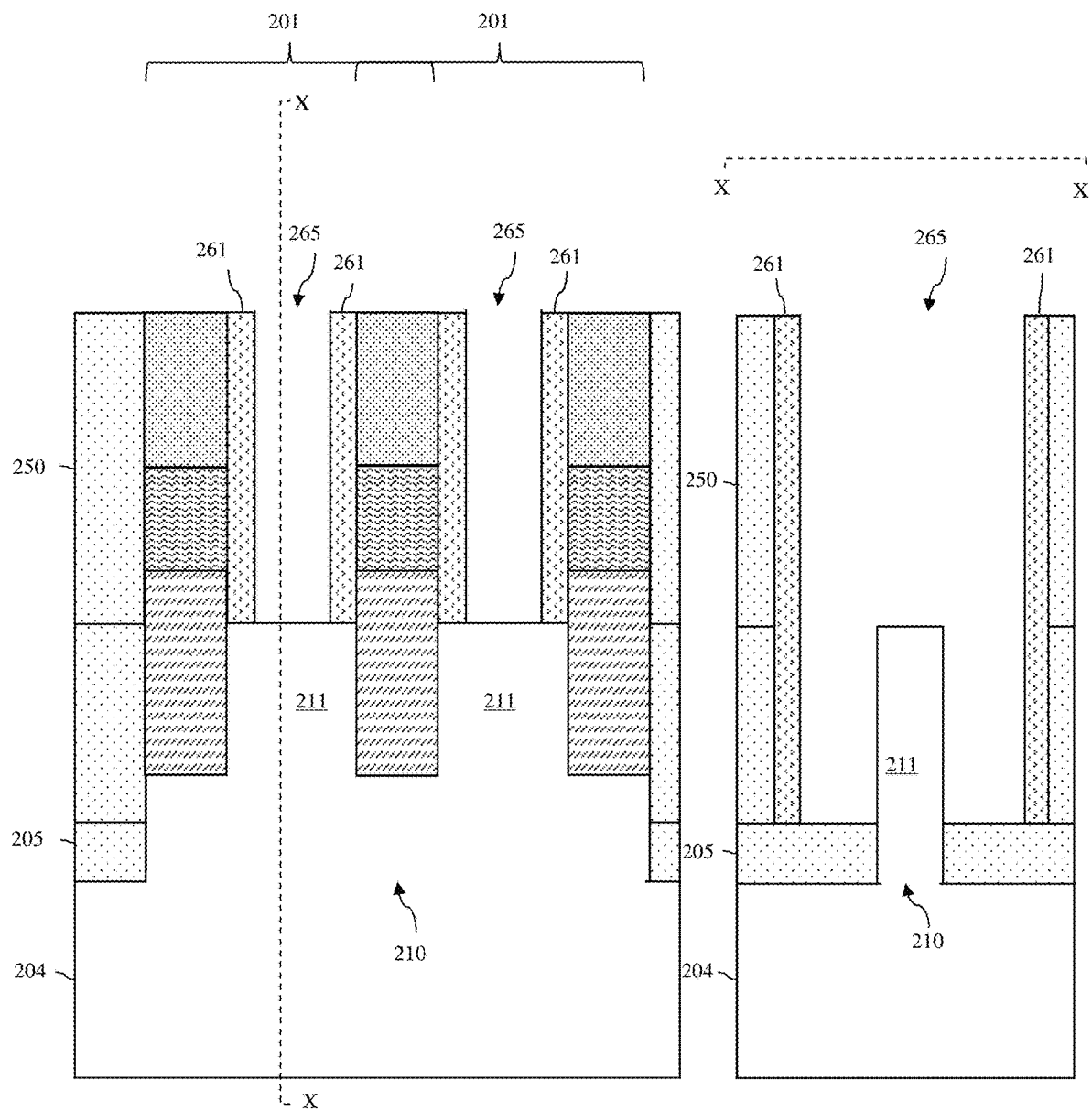

The method embodiments can include removing the sacrificial gate 260 (see process step 106 and FIGS. 3A-3B). For example, a polishing process (e.g., a CMP process) can be performed to remove the sacrificial gate cap 262 and expose the top surface of the sacrificial gate 260. Then, a selective etch process can be performed to selectively etch away the material of the second sacrificial gate layer without impacting the semiconductor body or exposed dielectric material (e.g., the gate sidewall spacers 261, the plug caps 249, the ILD material 250, etc.). As mentioned above, formation of the sacrificial gates 260 can include an optional first sacrificial gate layer (e.g., a thin conformal silicon dioxide layer). This thin silicon dioxide layer can protect the semiconductor material of the semiconductor body during removal of the second sacrificial gate layer and can be removed, for example, by buffered hydrofluoric acid (BHF). Removal of the sacrificial gate 260 creates a gate opening 265, which exposes the channel region 211 extending laterally through the gate opening (e.g., exposes the top surface and opposing sides of the semiconductor fin at the channel region 211 in the case of a single-fin FINFET, as illustrated), which exposes the STI region 205 at the bottom of the gate opening (e.g., on either side of the channel region 211 as shown in FIG. 3B) and, which exposes vertical surfaces of the sidewalls spacers 261 at the outside edges of the gate opening.

It should be noted that the FET design can be such that the RMG in the final FET structure has a small critical dimension (CD) (e.g., a gate length of 20 nm or less) and/or a high aspect ratio (AR) (e.g., an AR of 1:4 or higher, such as gate length of 20 nm or less to gate height of 80 nm or more). Thus, the gate opening 265 will have similar dimensions.

The method embodiments can further include forming a RMG within gate opening 265 (see process step 108). Each of the method embodiments includes depositing a conformal dielectric layer to line the gate opening 265 and then performing a series of conformal metal deposition and chamfer processes to selectively adjust the heights of the conformal metal layers within the gate opening 265.

In one embodiment of the method, the RMG can be formed at process step 108 using process flow A. Process flow A includes an unclustered metal deposition process, a chamfer process, a clustered metal deposition process and another chamfer process. In another embodiment of the method, the RMG can be formed at process step 108 using process flow B. Process flow B includes an unclustered metal deposition process, a chamfer process, an additional unclustered metal deposition process, another chamfer process, a clustered metal deposition process, and yet another chamfer process. As discussed below the additional unclustered deposition process can be employed to increase the thickness of a particular metal material at the bottom of the gate opening and, thereby selectively adjust the threshold voltage (Vt) of the FET being formed.

Figures 4A, 4B:
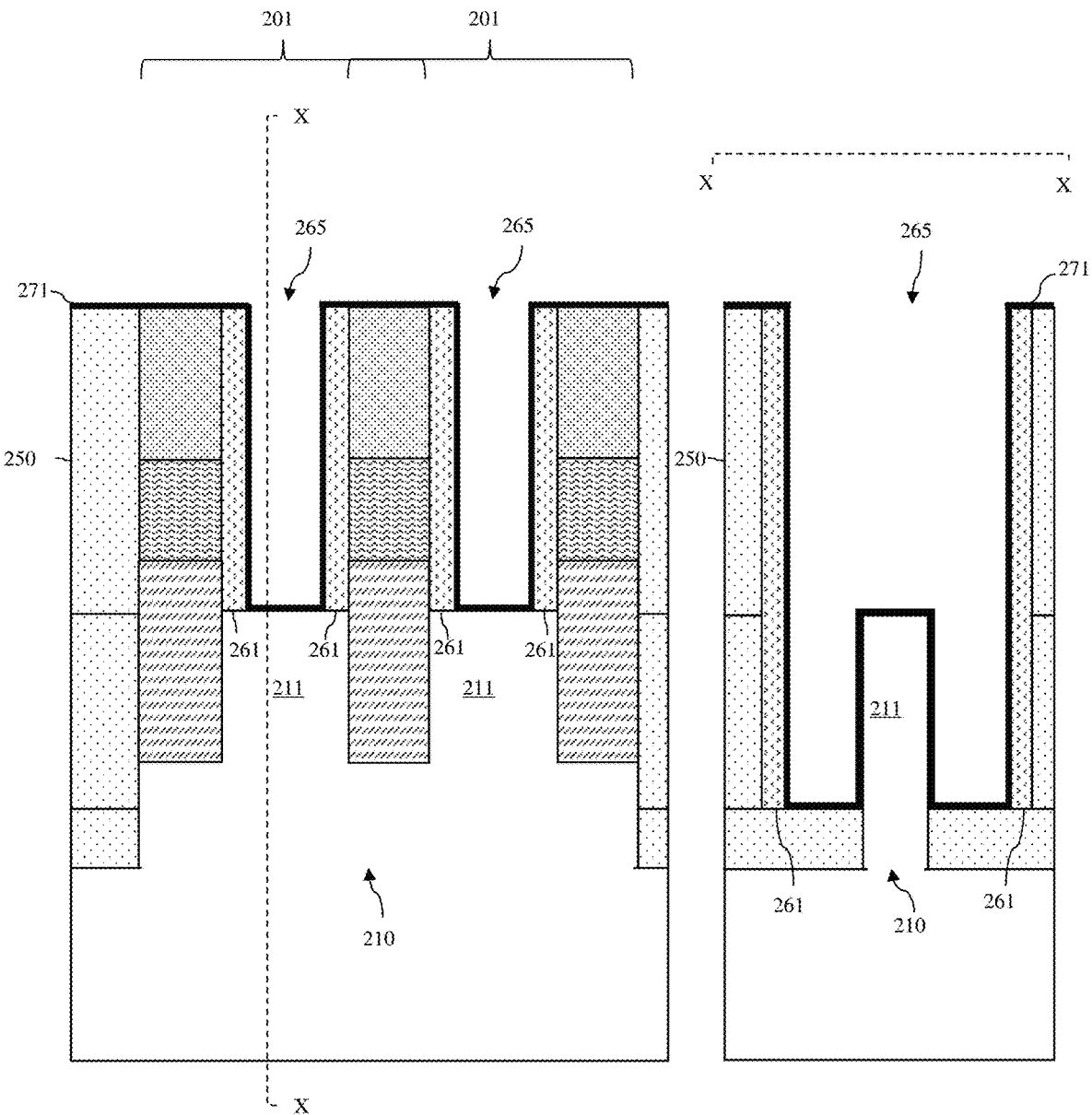

More particularly, process flow A and process flow B can both include depositing a conformal dielectric layer 271 into the gate opening 265 so as to line the gate opening 265 (see process step 110 of process flow A or process step 120 of process flow B and FIGS. 4A-4B). The conformal dielectric layer 271 can be a conformal high-K dielectric layer. Exemplary high-K dielectric materials include, but are not limited to, hafnium (HO-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). As a result of this conformal deposition process, the conformal dielectric layer 271 will have a portion covering the channel region 211 (i.e., immediately adjacent to the exposed surfaces of the channel region within the gate opening), a portion covering the STI region 205 at the bottom of the gate opening 265, a portion covering the vertical surfaces of the gate sidewall spacers 261 at the outer edges of the gate opening and a portion covering the top surface of the partially completed FET structure outside the gate opening (i.e., extending laterally over the gate sidewall spacers 261, plug caps 249, and ILD material 250).

Figures 5A, 5B:
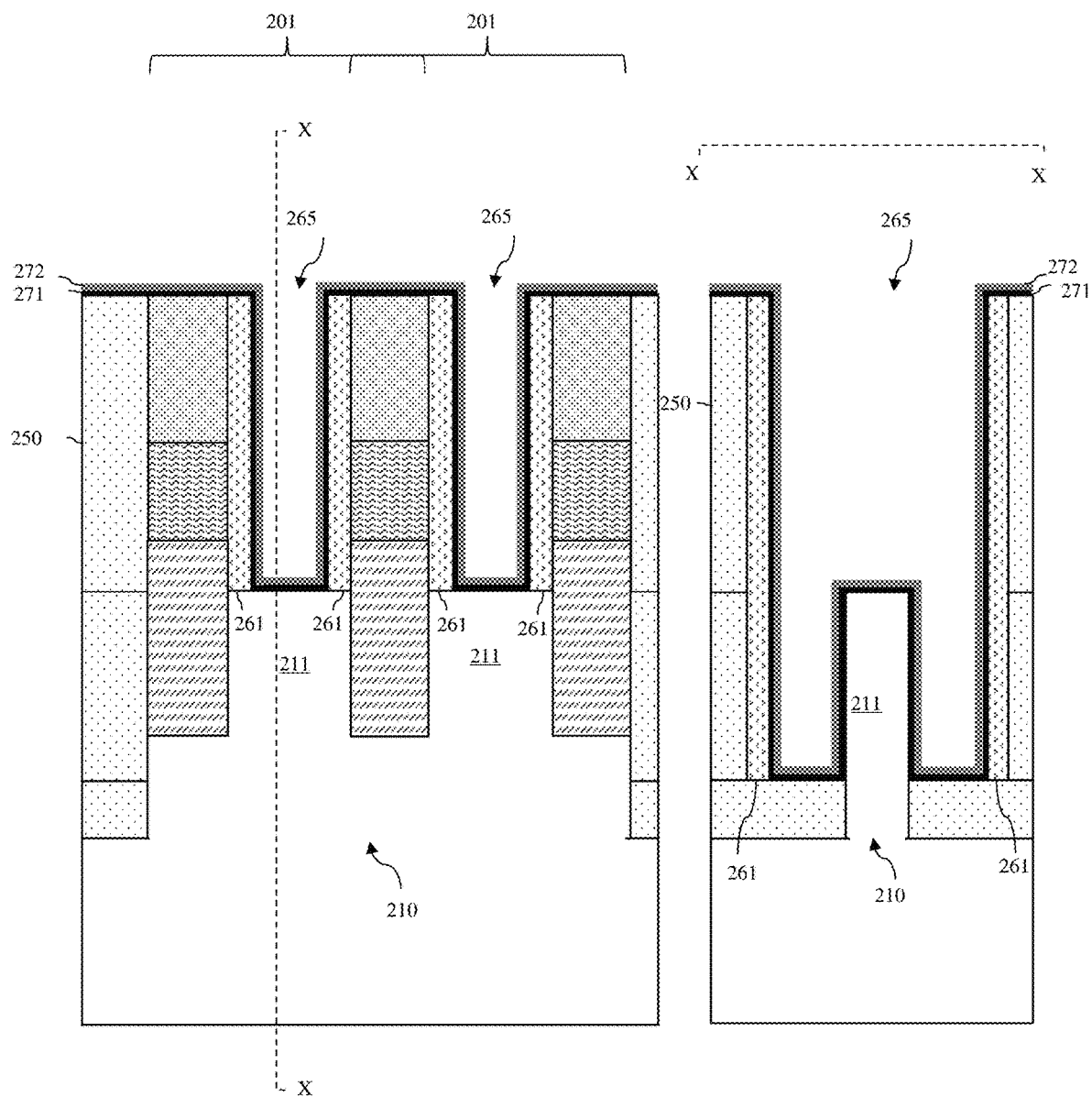
Figures 6A, 6B:
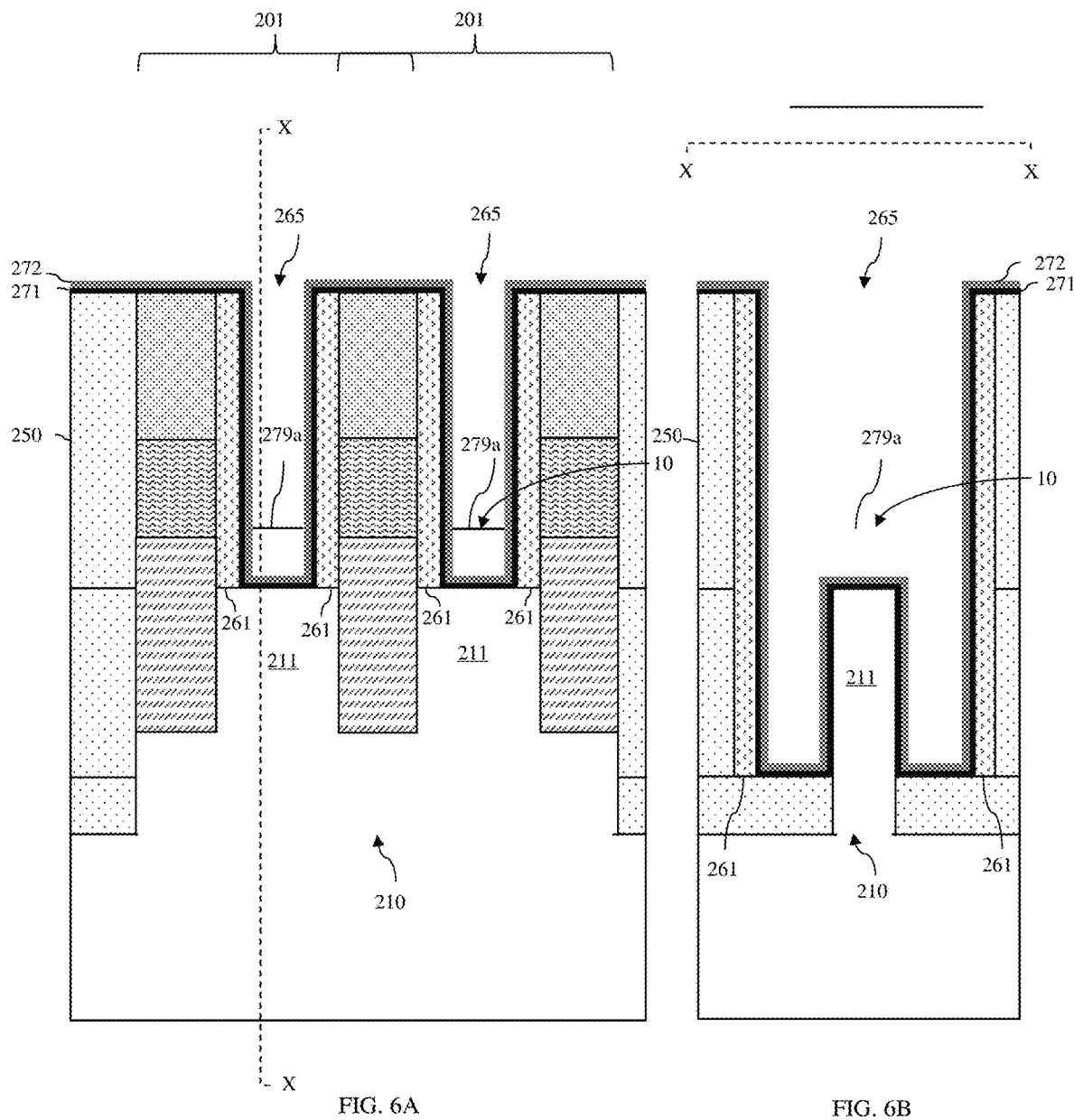

Process flow A and process flow B can both include depositing a first conformal metal layer 272 on the conformal dielectric layer 271 so as to further line the gate opening 265 (see process step 111 of process flow A or process step 121 of process flow B and FIGS. 5A-5B). The first conformal metal layer 272 can be, for example, a p-type work function metal layer. For purposes of this disclosure, "a p-type work function metal" refers to a metal that has an optimal gate conductor work function for a p-type FET (PFET) and, particularly, a work function between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). In one exemplary embodiment, the first conformal metal layer can be a titanium nitride (TiN) layer.

In any case, deposition of the first conformal metal layer 271 at process step 111 or 121 can be unclustered. Specifically, deposition of the first conformal metal layer can be performed in a deposition chamber. The wafer can then be removed from the deposition chamber (i.e., exposed to ambient air) following the deposition process and, particularly, prior to deposition of any other materials onto the first conformal metal layer. Since only the one layer is deposited, it is referred to as an "unclustered" layer.

Process flow A and process flow B can include preforming a chamfer process in order to etch back the first conformal metal layer 272 within the gate opening 265 to a height 10 above the level of the top surface of the channel region 211, thereby exposing a portion of the conformal dielectric layer 271 that is above the height 10 (see process step 112 of process flow A or process step 122 of process flow B and FIGS. 6A-6B and 7A-7B). Specifically, this chamfer process can include depositing a first planarization layer 279a on the first conformal metal layer 272 to fill the gate opening 265. The first planarization layer 279a can be, for example, an organic planarization layer (e.g., an amorphous carbon layer, an amorphous silicon layer, a polymer layer or any other suitable planarization layer). The first planarization layer 279a can then be recessed within the gate opening so that the top surface of the first planarization layer 279a is at the desired height 10 (see FIGS. 6A-6B). Next, the exposed metal of the first conformal metal layer 272 above the top surface of the first planarization layer 279a (i.e., above the height 10) can be selectively removed using a first selective isotropic etch process. For example, in the case of a titanium nitride first conformal metal layer 272, the first selective isotropic etch process can be a wet etch process performed with a standard cleaning solution number one (SC1), which consists of hydrogen peroxide ($H_2O_2$), ammonia, and water with a ratio of 1:1.5:50, at an elevated temperature (e.g., 50-70° C.) in order to improve etch rate. The first selective isotropic etch process can be followed by selective removal of the first planarization layer 279a so as to expose the remaining portion of the first conformal metal layer 271 in the lower portion of the gate opening 265 (see FIGS. 7A-7B).

Figures 8A, 8B:
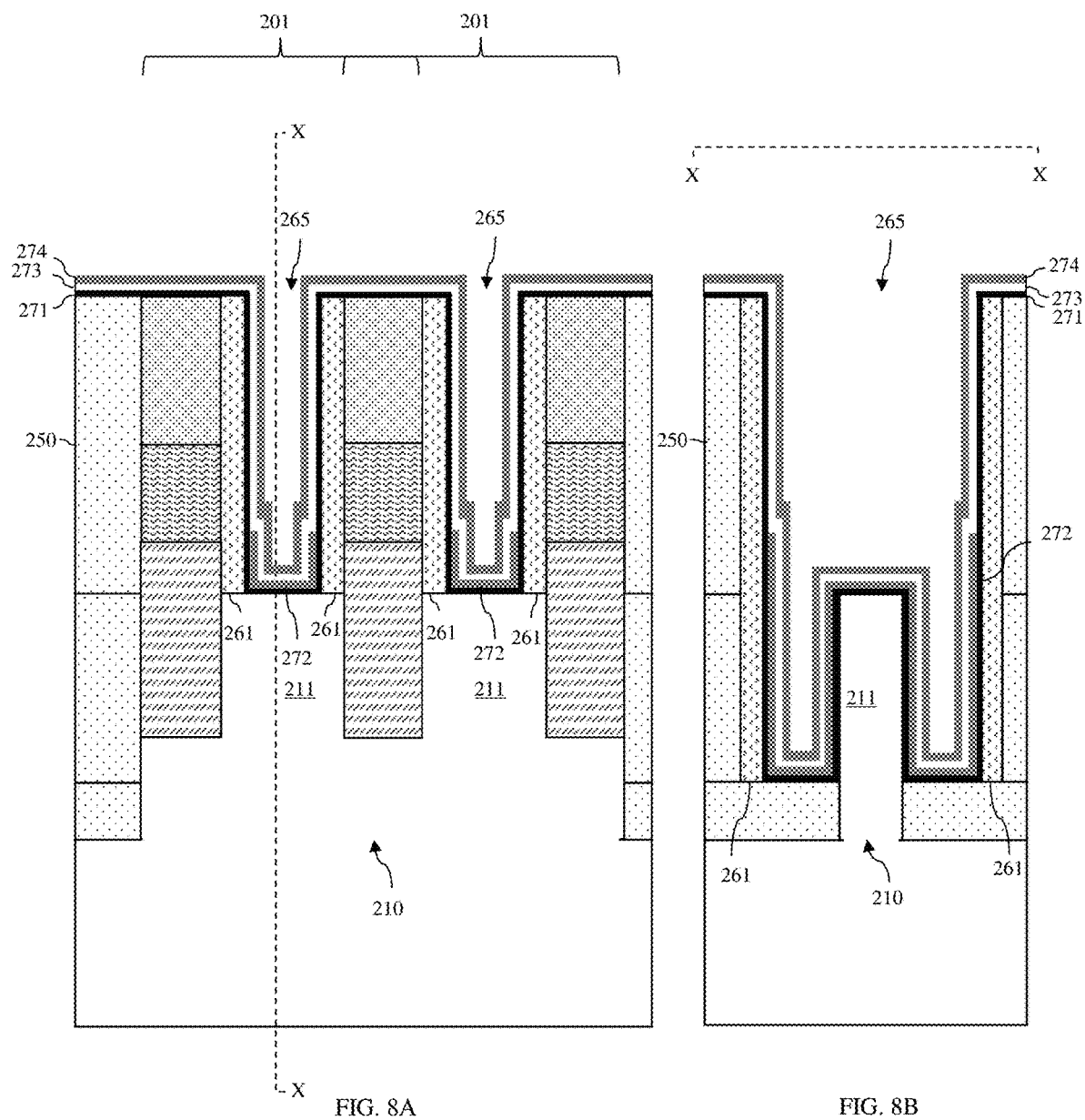
Figures 9A, 9B:
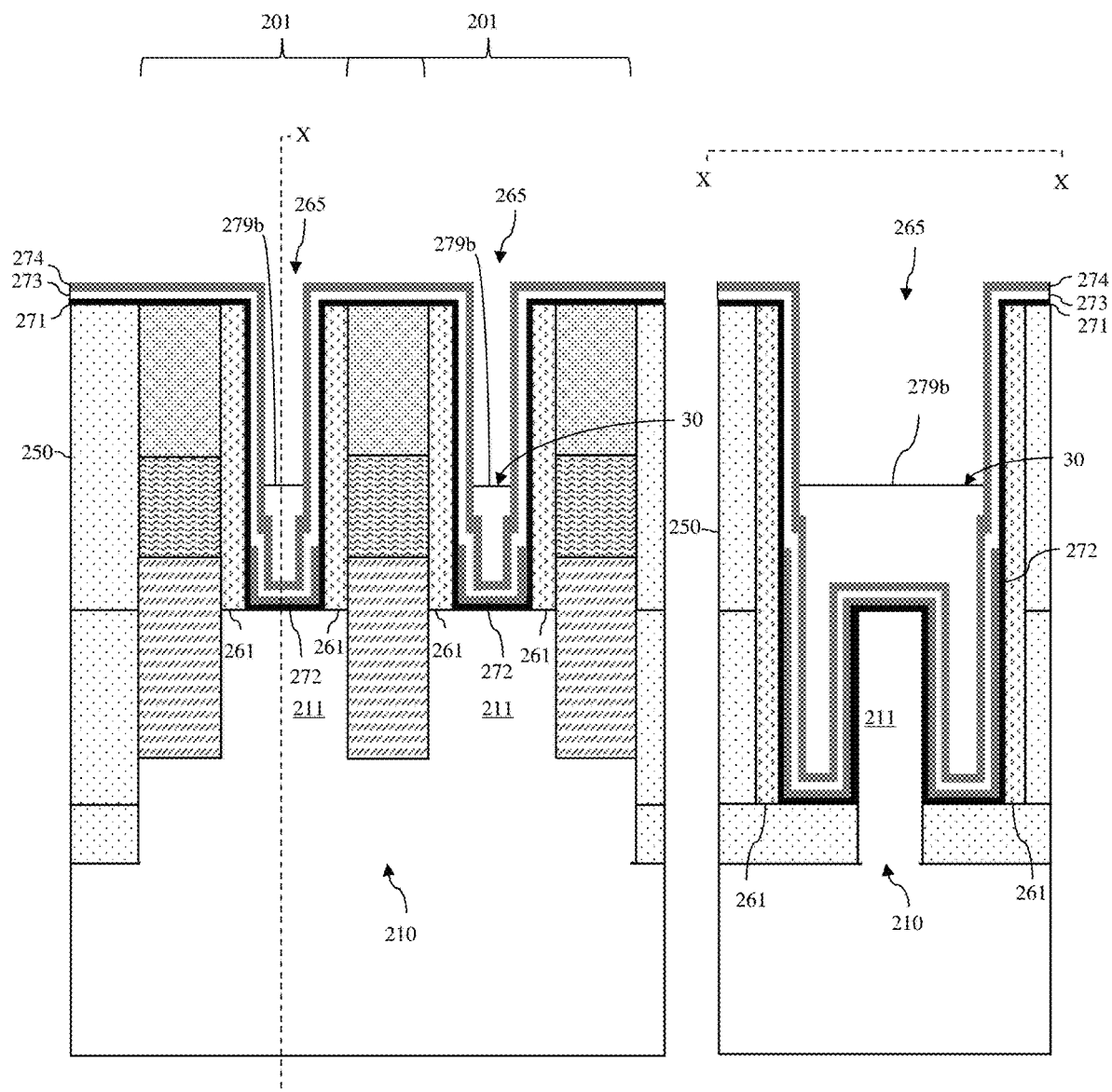

Referring specifically to process flow A of the flow diagram of FIG. 1, after the first conformal metal layer 272 is chamfered, additional conformal metal layers 273-274 can be deposited over the exposed upper portion of the conformal dielectric layer 271 and over the first conformal metal layer 272 so as to further line the gate opening 265 (see process step 113 of process flow A and FIGS. 8A-8B). These additional conformal metal layers can include, for example, an n-type work function metal layer. For purposes of this disclosure, "an n-type work function metal" refers to a metal that has an optimal gate conductor work function for an n-type FET (NFET) and, particularly, a work function between about 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, aluminum carbide, and titanium aluminum carbide. In one exemplary embodiment, this n-type work function metal layer 273 can be a titanium aluminum carbide (TiAlC) layer. These additional conformal metal layers can further include a barrier metal layer 274 on the n-type work function metal layer 273. The barrier metal layer 274 can be, for example, a titanium nitride layer, a fluorine-free tungsten layer or any other suitable barrier metal layer 274. In one exemplary embodiment, the barrier metal layer 274 is a titanium nitride (TiN) layer. In any case, deposition of the additional conformal metal layers 273-274 can be clustered. That is, the additional conformal metal layers can be deposited in succession within a deposition chamber without removing the wafer from the deposition chamber and, thus, without exposing any of the additional conformal metal layers to ambient air between deposition processes. Clustering of these layers is particularly important when oxygen in the air would react with the n-type work function metal layer and alter its electrical properties (i.e., its work function). For example, the aluminum in some n-type work function metal layers (e.g., in TiAlC) can react with oxygen.

After the additional conformal metal layers have been deposited, another chamfer process can be performed to etch back the additional conformal metal layers 273-274 within the gate opening 265 to a height 30 (which is greater than the height 10) above the level of the top surface of the channel region 211, thereby exposing an upper portion of the conformal dielectric layer 271 above the height 30 (i.e., a smaller upper portion than was exposed after the earlier chamfer process) (see process step 114 of process flow A and FIGS. 9A-9B and 10A-10B). Specifically, this chamfer process can include depositing a second planarization layer 279b on the uppermost additional conformal layer (i.e., on the barrier metal layer 274) to fill the gate opening 265. The second planarization layer 279b, like the first planarization layer 279a, can be an organic planarization layer (e.g., an amorphous carbon layer, an amorphous silicon layer, a polymer layer or any other suitable planarization layer). The second planarization layer 279b can then be recessed within the gate opening so that the top surface of the second planarization layer 279b is at the desired height 30 (see FIGS. 9A-9B). Next, the exposed metal of the additional conformal metal layers 273-274 above the top surface of the second planarization layer 279b (i.e., above the height 30) can be selectively removed using a second selective isotropic etch process.

It should be noted that the second selective isotropic etch process used on the additional conformal metal layers 273-274 during this chamfer process can be different from the first selective isotropic etch process used on the first conformal metal layer 272 during the earlier chamfer process. Specifically, the specifications of this second selective isotropic etch process can be predetermined and tuned, based on the different metal materials of the additional conformal metal layers and also based on reactivity at the interface between the conformal dielectric layer 271 and the lowermost additional conformal metal layer (i.e., the n-type work function metal layer 274).

For example, consider the exemplary embodiment where the conformal dielectric layer is a high-k dielectric layer, where the first conformal metal layer 272 is a titanium nitride p-type work function metal layer and where the additional conformal metal layers are a titanium aluminum carbide n-type work function metal layer 273 and a titanium nitride barrier layer 274. In this case, if the first selective isotropic etch process, described above, were to be used when etching the additional conformal metal layers, the etch rate of the titanium aluminum carbide (particularly at the interface with the high-k dielectric) in a downward vertical direction (e.g., toward the STI region 205) will be significantly faster than the etch rate of the titanium nitride. Thus, the top ends these materials would be at different heights following the etch process. Consequently, a different selective isotropic etch process is required where the etch rate of the exposed metal material of all the additional conformal metal layers, including at the interface between the titanium aluminum carbide n-type work function metal layer 273 and the high-K dielectric layer 271, is controlled and essentially uniform in the downward vertical direction.

In one exemplary embodiment, this controlled and essentially uniform etch of titanium aluminum carbide and titanium nitride in the downward vertical direction can be achieved with a wet etch process that includes, for example, using the standard cleaning solution number one (SC1), discussed above with regard to the first selective isotropic etch process, but with a higher concentration of the ammonia base (e.g., more than 1.5 parts ammonia) and at lower temperature (e.g., at room temperature) for a first clean step and further using diluted hydrofluoric acid (DHF) for an oxide strip step. By ensuring that the etch rate is controlled and essentially uniform in the downward vertical direction, this wet etch process further ensures that top ends of the additional conformal metal layers 273 and 274 at about the same desired height 30 (e.g., essentially co-planar).

Figures 10A, 10B:
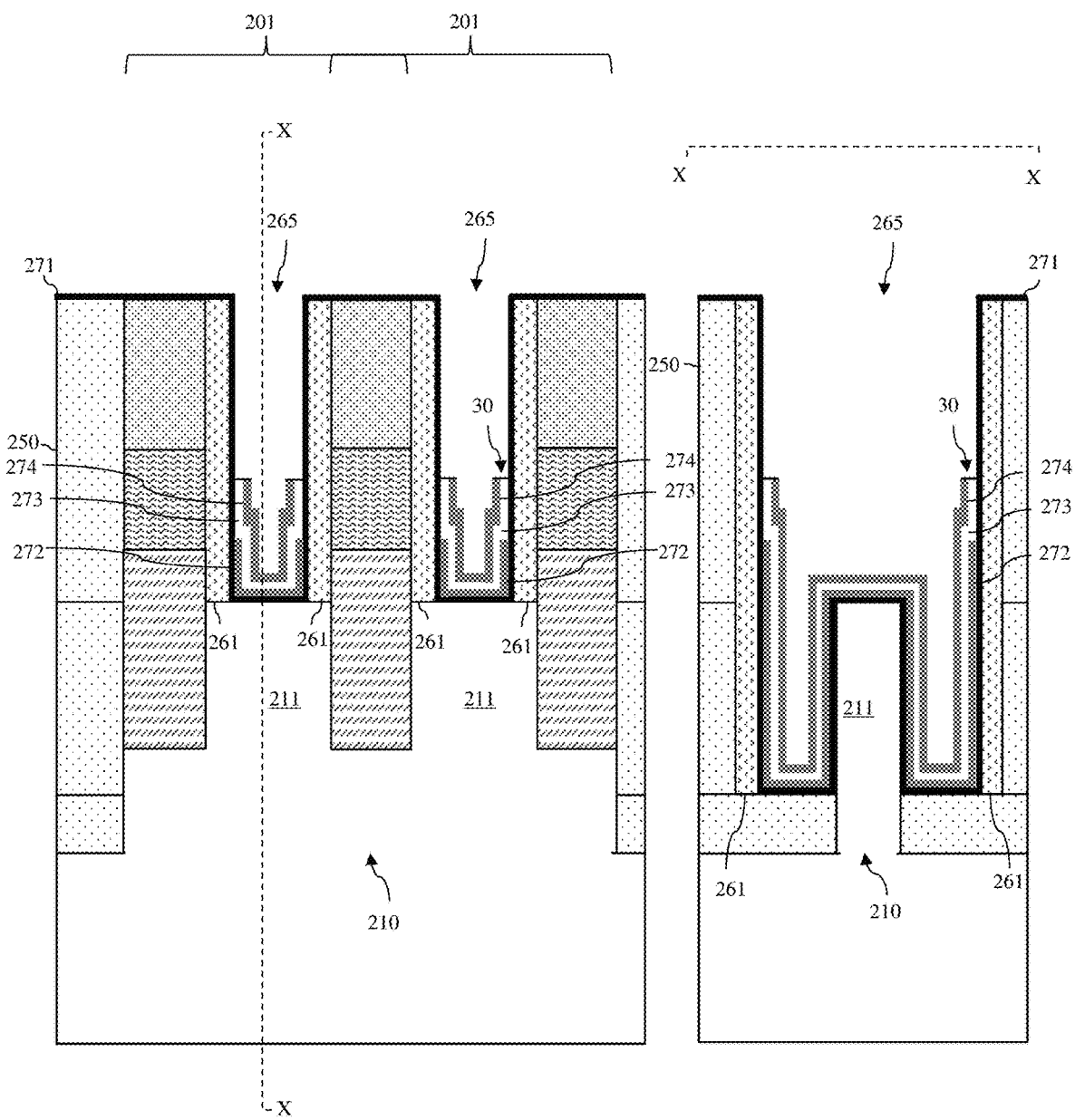

The second selective isotropic etch process can be followed by selective removal of the second planarization layer 279b so as to expose top ends of the additional conformal metal layers 273 and 274 as well the entire top surface of the barrier metal layer 274 (see FIGS. 10A-10B).

Additional RMG processing can then be performed in order to complete each RMG 280 and, thereby to complete each FET 291 (see process step 115 of process flow A and FIGS. 11A-11B). The additional RMG processing can include, but is not limited to, depositing a conductive fill material 275 onto the barrier metal layer 274 so as to fill the gate opening. The conductive fill material 275 can be, for example, tungsten, cobalt, aluminum, nickel, copper, doped polysilicon, or any other suitable low resistance conductive fill material. Optionally, the conductive fill material 275 can be polished (e.g., an optional CMP can be performed). Then, the conductive fill material 275 can be etched back within the gate opening to a height 50, which is higher than the height 30 of the top ends of the additional conformal metal layers 273-274 discussed above. This height 50 of the conductive fill material 275 can specifically be some predetermined/desired overall gate height above the level of the top surface of the channel region 211. It should be noted that the etch process used to etch back the conductive fill material 275 can also result in etching back of the exposed upper portion of the conformal dielectric layer 271 (e.g., to about the same height 30 as the top ends of the additional conformal metal layers). Alternatively, an additional etch process could be used to remove the exposed upper portion of the conformal dielectric layer 271 (e.g., so that the top end of the conformal dielectric layer is at about the same height 30 of the top ends of the additional conformal metal layers). Next, a dielectric gate cap material can be deposited so as to fill the gate opening and a polishing process (e.g., a CMP process) can be perform so as to remove the dielectric gate cap material from above the top surface of the ILD material 250, thereby forming a dielectric gate cap 276 on each RMG 280'.

Figures 12A, 12B:
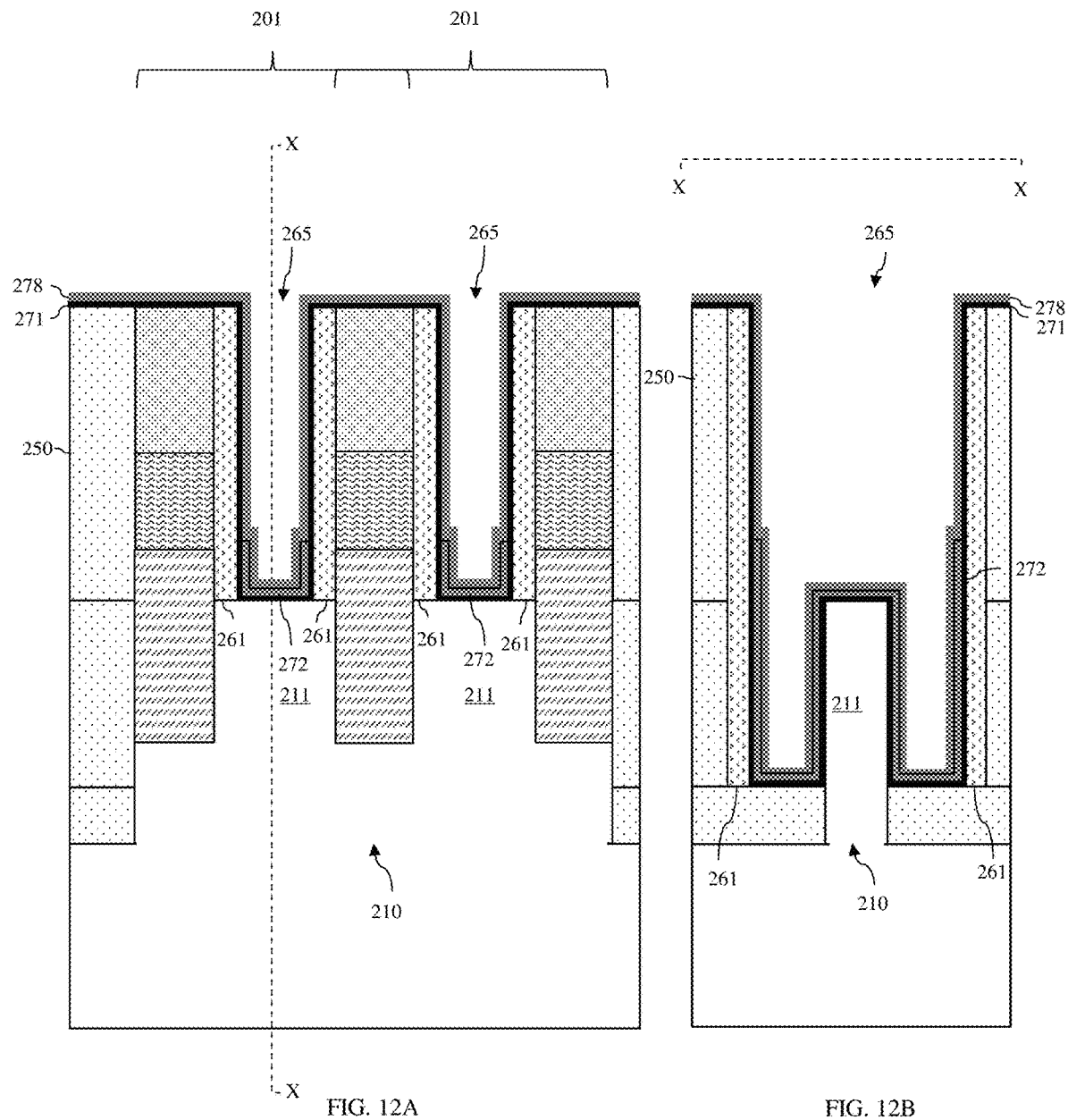
Figures 13A, 13B:
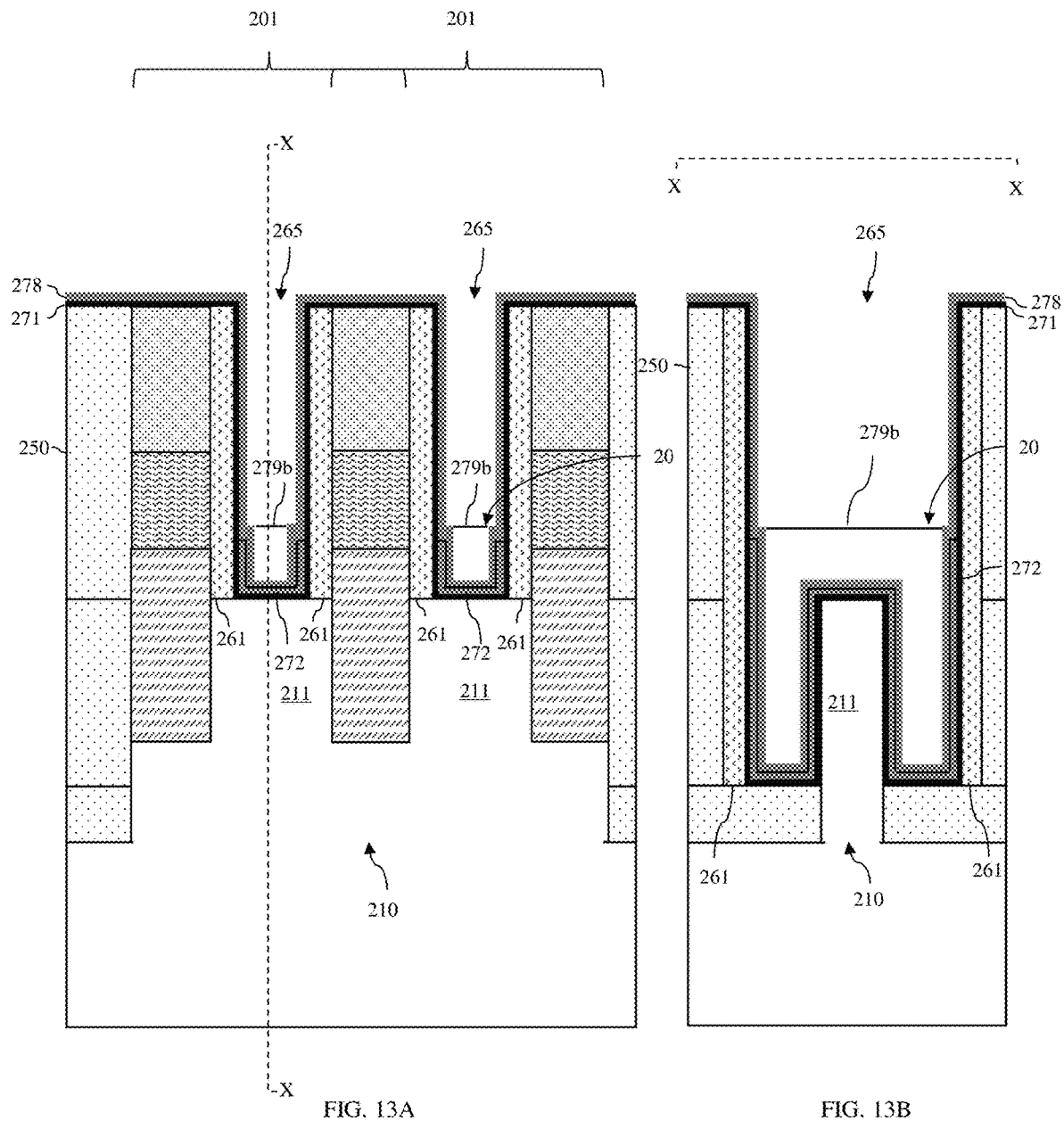
Figures 14A, 14B:
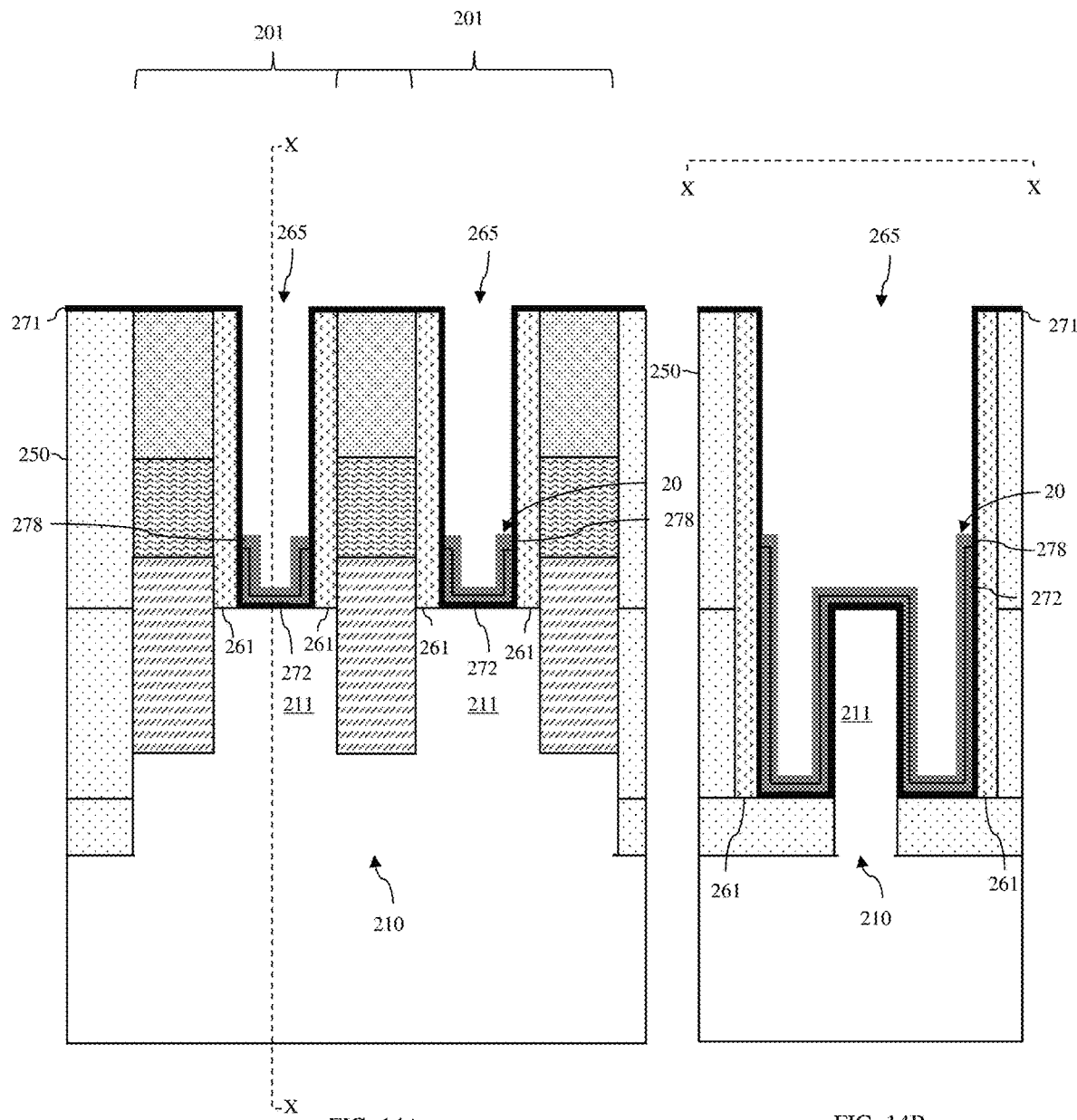

Referring now to process flow B of the flow diagram of FIG. 1, after chamfering the first conformal metal layer 272, an optional second conformal metal layer 278 can be deposited over the exposed upper portion of the conformal dielectric layer 271 and over the first conformal metal layer 272 so as to further line the gate opening 265 (see process step 123 of process flow B and FIGS. 12A-12B). The second conformal metal layer 278 can, like the first conformal metal layer 272, be a p-type work function metal layer. For example, the second conformal metal layer 278 can be made of the same p-type work function metal as the first conformal metal layer. In one exemplary embodiment, this p-type work function metal can be titanium nitride. The second conformal metal layer 278 can, for example, be deposited so as to increase the thickness of the p-type work function metal adjacent to the channel region 211 and, thereby to selectively adjust (i.e., tune) the threshold voltage (Vt) of the FET being formed. In any case, deposition of the second conformal metal layer 278 at process step 123 can be unclustered.

Next, another chamfer process can be performed in order to etch back the second conformal metal layer 278 within the gate opening 265 to a height 20 (which is greater than the height 10) above the level of the top surface of the channel region 211, thereby exposing an upper portion of the conformal dielectric layer 271 that is above the height 20 (i.e., a smaller upper portion than was exposed after the earlier chamfer process) (see process step 124 of process flow B and FIGS. 13A-13B and 14A-14B). Specifically, this chamfer process can include depositing a second planarization layer 279b on the second conformal metal layer 278 to fill the gate opening 265. Like the first planarization layer 279a, the second planarization layer 279b can be an organic planarization layer (e.g., an amorphous carbon layer, an amorphous silicon layer, a polymer layer or any other suitable planarization layer). The second planarization layer 279b can then be recessed within the gate opening so that the top surface of the second planarization layer 279b is at the desired height 20 (see FIGS. 13A-13B). Next, the exposed metal of the second conformal metal layer 278 above the top surface of the second planarization layer 279b (i.e., above the height 20) can be selectively removed (e.g., using the same first selective isotropic etch process used for chamfering the first conformal meta layer 272, as discussed above). The second planarization layer 279b can then be selectively removed so as to expose the remaining portion of the second conformal metal layer 278 (see FIGS. 14A-14B).

Figures 15A, 15B:
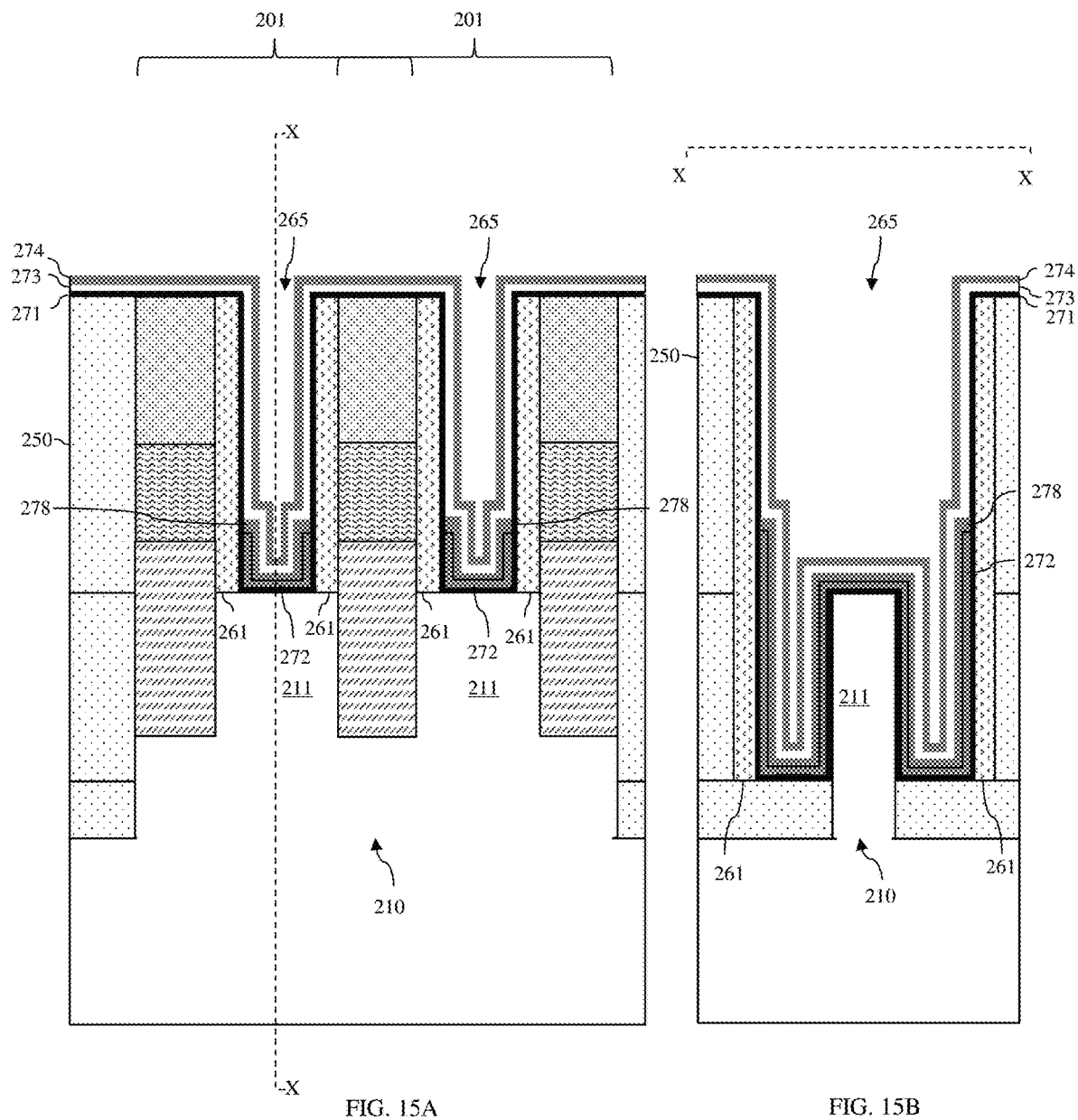
Figures 16A, 16B:
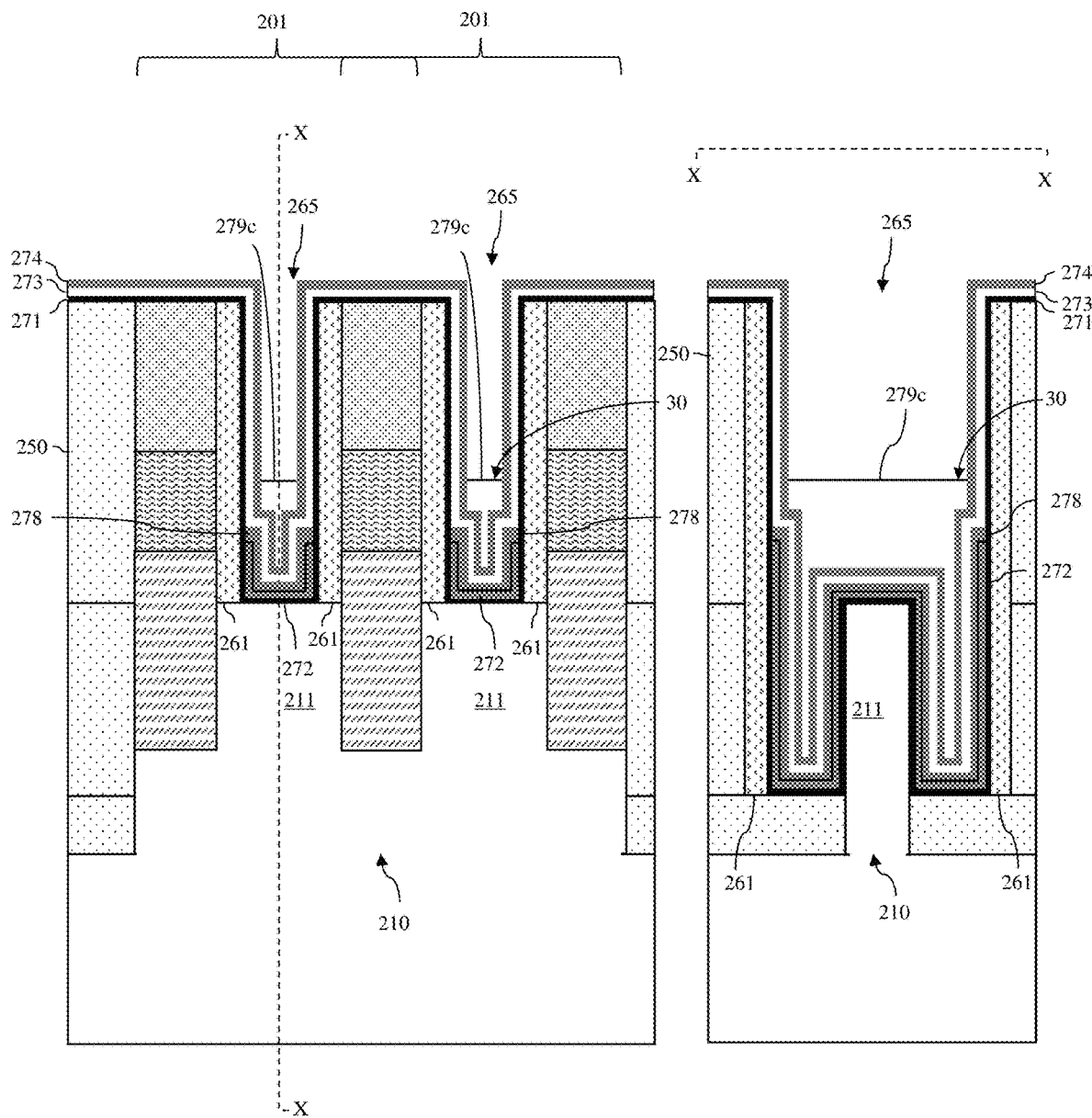
Figures 17A, 17B:
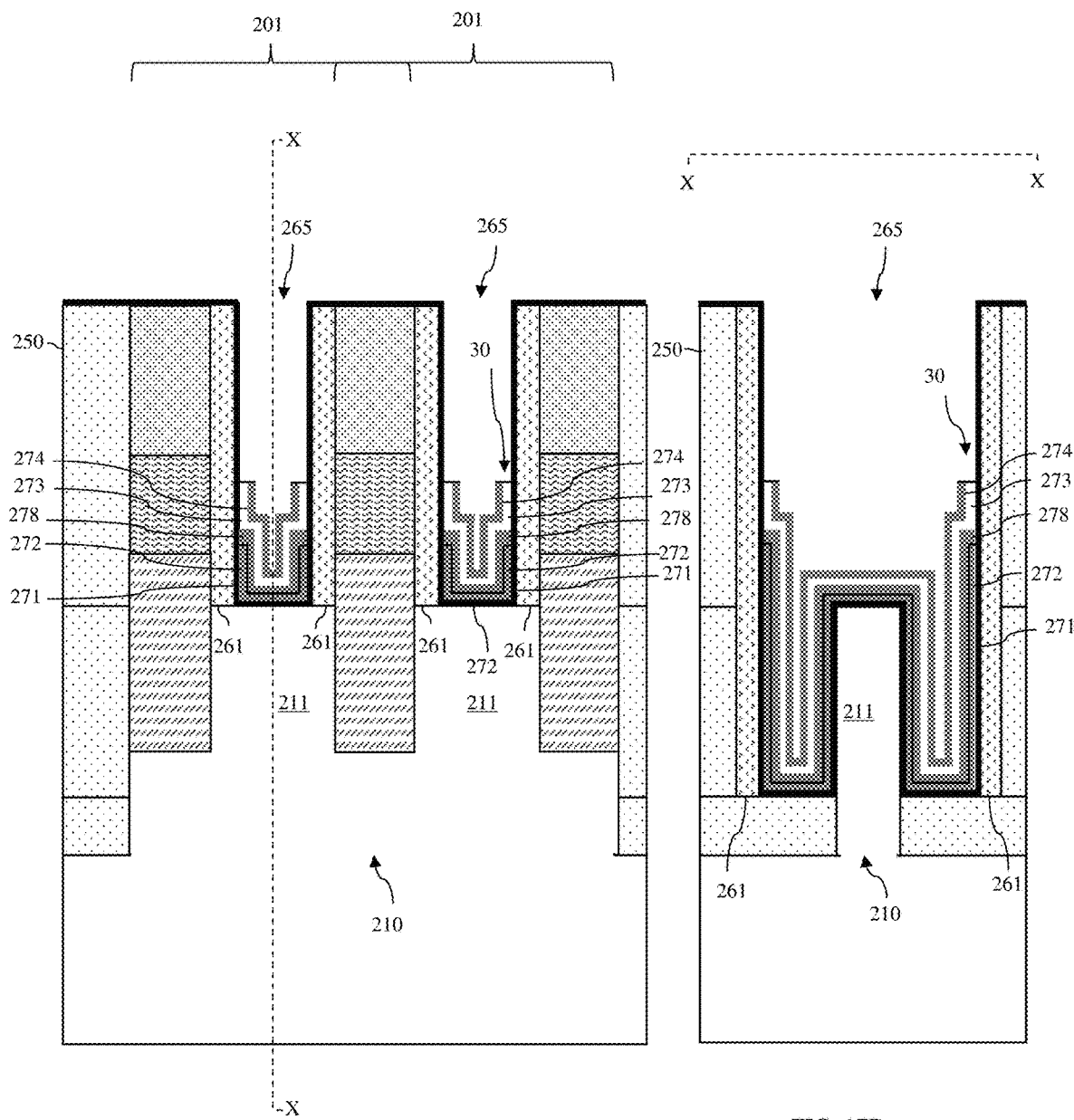

Next, additional conformal metal layers 273-274 can be deposited over the exposed upper portion of the conformal dielectric layer 271 and over the second conformal metal layer 278 so as to further line the gate opening 265 (see process step 125 of process flow B and FIGS. 15A-15B). As discussed in detail above with regard to process step 113 of process flow A, the additional conformal metal layers can include, for example, an n-type work function metal layer 273 and a barrier metal layer 274 on the n-type work function metal layer 273. In one exemplary embodiment, this n-type work function metal layer 273 can be a titanium aluminum carbide (TiAlC) layer and the barrier metal layer 274 can be a titanium nitride (TiN) layer. In any case, deposition of the additional conformal metal layers 273-274 can be clustered. Clustering of these additional conformal metal layers is particularly important when/if oxygen in the air can react with the n-type work function metal layer and alter its electrical properties (i.e., its work function). For example, the aluminum in some n-type work function metal layers (e.g., in TiAlC) can react with oxygen and so clustering protects the TiAlC.

After the additional conformal metal layers have been deposited, yet another chamfer process can be performed to etch back the additional conformal metal layers 273-274 within the gate opening 265 to a height 30 (which is greater than the heights 10 and 20) above the level of the top surface of the channel region 211, thereby exposing an upper portion of the conformal dielectric layer 271 above the height 30 (i.e., a smaller upper portion than was exposed after the previous chamfer processes) (see process step 126 and FIGS. 16A-16B and 17A-17B). Specifically, this chamfer process can include depositing a third planarization layer 279c on the uppermost additional conformal layer (i.e., on the barrier metal layer 274) to fill the gate opening 265. Like the first and second planarization layers, the third planarization layer 279c can be an organic planarization layer (e.g., an amorphous carbon layer, an amorphous silicon layer, a polymer layer or any other suitable planarization layer). The third planarization layer 279c can then be recessed within the gate opening so that the top surface of the third planarization layer 279c is at the desired height 30 (see FIGS. 16A-16B). Next, the exposed metal of the additional conformal metal layers 273-274 above the top surface of the third planarization layer 279c (i.e., above the height 30) can be selectively removed using a second selective isotropic etch process. The second selective isotropic etch process used on the additional conformal metal layers 273-274 can be different from the first selective isotropic etch process used on the first conformal metal layer 272 and the second conformal metal layer 278. Specifically, the specifications of this second selective isotropic etch process can be predetermined and tuned, based on the different metal materials of the additional conformal metal layers and also based on reactivity at the interface between the conformal dielectric layer 271 and the lowermost additional conformal metal layer (i.e., the n-type work function metal layer 274).

It should also be noted that the second selective isotropic etch process used on the additional conformal metal layers 273-274 at process step 126 can be the same as that used on the additional conformal metal layers at process step 114 of process flow A (discussed in detail above). For example, in one exemplary embodiment, a controlled and essentially uniform etch of titanium aluminum carbide and titanium nitride in the downward vertical direction can be achieved with a wet etch process that includes, for example, using the standard cleaning solution number one (SC1), discussed above with regard to the first selective isotropic etch process, but with a higher concentration of the ammonia base (e.g., more than 1.5 parts ammonia) and at lower temperature (e.g., room temperature) for a first clean step and further using diluted hydrofluoric acid (DHF) for an oxide strip step. Again, by ensuring that the etch rate is controlled and essentially uniform in the downward vertical direction, this wet etch process further ensures that top ends of the additional conformal metal layers 273 and 274 are at about the desired height 30 (e.g., essentially co-planar). The second selective isotropic etch process can be followed by selective removal of the third planarization layer 279c so as to expose top ends of the additional conformal metal layers 273 and 274 as well the entire top surface of the barrier metal layer 274 (see FIGS. 17A-17B).

Figures 18A, 18B:
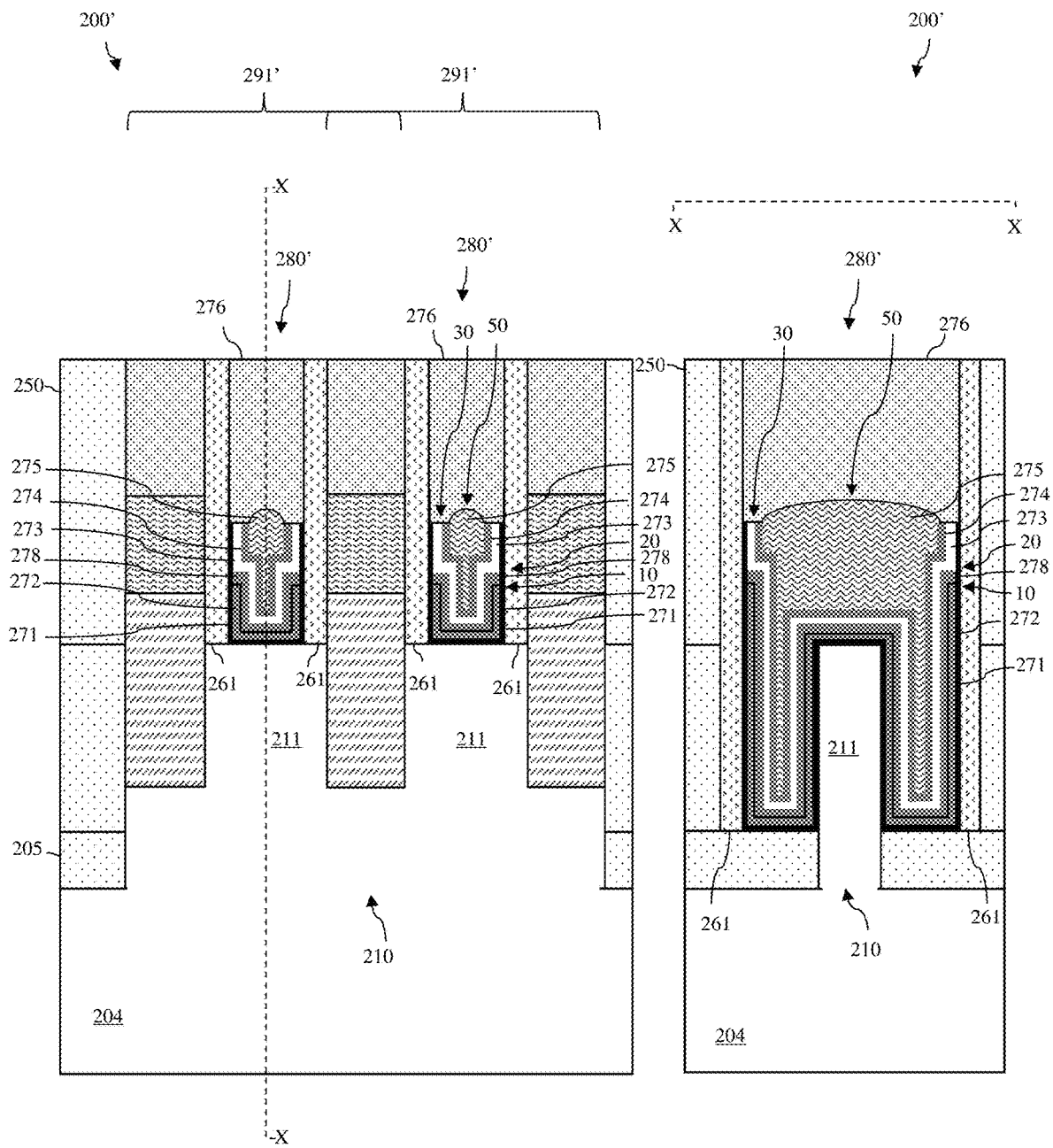
FIGS. 18A-18B are cross-section diagrams illustrating another embodiment of a FET having a RMG.

Additional RMG processing can then be performed in order to complete each RMG 280' and, thereby each FET 291' (see process step 127 of process flow B and FIGS. 18A-18B). The additional processing can be essentially the same as that described in detail above with regard to process step 115 of process flow A. That is, the additional processing can include, but is not limited to, depositing a conductive fill material 275 onto the barrier metal layer 274 so as to fill the gate opening. Optionally, the conductive fill material 275 can then be polished (e.g., an optional CMP can be performed). Then, the conductive fill material 275 can be etched back within the gate opening to a height 50, which is, for example, slightly higher than the height 30 of the top ends of the additional conformal metal layers 273-274 discussed above. The height 50 can specifically be some predetermined/desired gate height above the level of the top surface of the channel region 211. It should be noted that the etch process used to etch back the conductive fill material 275 can also result in etching back of the exposed upper portion of the conformal dielectric layer 271 (e.g., to the same height 30 of the top ends of the additional conformal metal layers). Alternatively, an additional etch process could be used to remove the exposed upper portion of the conformal dielectric layer 271 (e.g., so that the top end of the conformal dielectric layer 271 is at about the same height 30 as the top ends of the additional conformal metal layers). Next, a dielectric gate cap material can be deposited so as to fill the gate opening and a polishing process (e.g., a CMP process) can be perform so as to remove the dielectric gate cap material from above the top surface of the ILD material 250, thereby forming a dielectric gate cap 276 on each RMG 280'.

It should be noted that in each of the process flows A and B described above, techniques for controlled recessing of planarization layers and for subsequent removal of the planarization layers are well known in the art. Thus, the details of such techniques have been omitted from this specification in order to allow the reader to focus on the salient aspects of the disclosed methods.

Following the completion of the RMG(s) 280 (see process flow A, shown in FIGS. 11A-11B) or the completion of the RMG(s) 280' (see process flow B, shown in FIGS. 18A-18B), additional processing (not shown) can be performed to complete the respective semiconductor structures 200 and 200' (see process step 130). The additional processing can include MOL processing including, but is not limited to, gate and source/drain contact formation. The additional processing can also include back end of the line (BEOL) processing.

Regardless of the process flow used (i.e., A or B), due to the unclustered deposition and subsequent chamfering of the first conformal metal layer 272 (and, if applicable, the second conformal metal layer 278), the disclosed method embodiments effectively increase the volume of available space that is within the upper part of the gate opening 265 during deposition and chamfering of the additional conformal metal layers 273-274 and this is done without having to increase the actual the size of the upper part of that gate opening. By increasing the volume of available space in the upper part of the gate opening, the method embodiments overcome problems associated with deposition of material into and/or removing material from a gate opening 265 with a small CD and/or high AR. Thus, the heights of the top ends of the conformal metal layers and, thereby the overall gate height 50 of the resulting RMG 280, 280' can be effectively controlled so that gate heights are essentially uniform across the wafer and from wafer-to-wafer. Furthermore, by clustering of the additional conformal metal layers 273-274, the disclosed method embodiments still protect the n-type work function metal layer 273 from oxidizing (which as discussed above can alter the work function).

Also disclosed herein are embodiments of a metal gate (e.g., a replacement metal gate (RMG)) for a field effect transistor (FET) formed according to the above-described methods (e.g., see the RMG 280 in the FETs 291 in the semiconductor structure 200 shown in FIGS. 11A-11B and the RMG 280' in the FETs 291' in the semiconductor structure 200' of FIGS. 18A-18B).

The semiconductor structures 200, 200' can be formed on a bulk or SOI semiconductor wafer, as discussed above with regard to the method embodiments. Each FET 291, 291' can be, for example, a single-fin fin-type field effect transistor (single fin FINFET) (as illustrated). Alternatively, each FET 291, 291' could have different FINFET configuration (e.g., can be a multi-fin FINFET). Alternatively, each FET 291, 291' could be a planar FET, a gate-all-around FET (GAAFET), or any other suitable type of FET structure.

In any case, each FET 291, 291' can include a semiconductor body 210 (e.g., a semiconductor fin for a FIFNET) and, in the semiconductor body 210, a channel region 211 positioned laterally between source/drain regions 213. Each FET 291, 291' can further include a metal gate 280, 280' (e.g., a replacement metal gate (RMG)) on the channel region 211 (as described in greater detail below). Each FET 291, 291' can further include dielectric gate sidewall spacers 261 positioned laterally adjacent to the sidewalls of the RMG 280, 280' (e.g., a RMG) and a dielectric gate cap 276 above the RMG 280, 280'.

As discussed in detail above with regard to the method embodiments, the gate sidewall spacers 261 define the limits of the gate opening within which the RMG 280, 280' is formed. Gate sidewall spacers 261 can be positioned laterally between sidewalls of the RMG 280, 280' and the source/drain regions 213 such that they traverse the semiconductor body 210 on either side of the channel region 211 (as shown in FIGS. 11A and 18B, respectively). Additional gate sidewall spacers 261 could be positioned laterally adjacent to other sidewalls of the RMG 280, 280' such that they are parallel to and on either side of the semiconductor body 210 at the channel region 211 (as shown in FIGS. 11B and 18B, respectively).

Each FET 291, 291' can further include metal plugs 248 on the source/drain regions 213 and dielectric plug caps 249 on the metal plugs 248. Interlayer dielectric (ILD) material 250 can laterally surround the FETs. Such features are well known in the art and, thus, the details thereof have been omitted from this specification in order to allow the reader to focus on the salient aspects of the disclosed embodiments. In any case, the top surfaces of the ILD material 250, gate sidewall spacers 261, the dielectric plug caps 249 and dielectric gate cap(s) 276 can be essentially co-planar (e.g., due to chemical mechanical polishing (CMP)).

The RMG 280, 280' can, for example, have a small critical dimension (CD) (e.g., a gate length of 20 nm or less) and/or a high aspect ratio (AR) (e.g., an AR of 1:4 or higher, such as gate length of 20 nm or less to gate height of 80 nm or more).

The RMG 280, 280' can include a conformal dielectric layer 271. The conformal dielectric layer 271 can be a conformal high-K dielectric layer. Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The conformal dielectric layer 271 will have a portion immediately adjacent to and covering the channel region 211 (e.g., adjacent to the top surface and the opposing sidewalls of the semiconductor body 210 at the channel region 211 in the case of a FINFET, as shown in FIGS. 11B and 18B), a portion immediately adjacent to and covering the STI region 205 at the bottom of the gate opening (e.g., on opposing sides of the semiconductor body 211 at the channel region 211, as shown in FIGS. 11B and 18B) and a portion positioned laterally immediately adjacent to vertical surfaces of the gate sidewall spacers 261 (e.g., as shown in FIGS. 11A-11B and 18A-18B).

The RMG 280, 280' can further include multiple conformal metal layers, which, as discussed above, were formed through a series of deposition and chamfer processes.

In each of the embodiments, the conformal metal layers can include a first conformal metal layer 272 immediately adjacent to the conformal dielectric layer 271 opposite the channel region 211, opposite the STI 205 and further opposite lower portions of the vertical surfaces of the gate sidewall spacers 261. As discussed above with regard to the method, the first conformal metal layer 272 is an unclustered metal layer and, due to a chamfer process, the top end of the first conformal metal layer 272 is at given height 10 above the level of a top surface of the channel region 211 but below a level of a top end of the conformal dielectric layer 171. The first conformal metal layer 272 can be, for example, a p-type work function metal layer. For purposes of this disclosure, "a p-type work function metal" refers to a metal that has an optimal gate conductor work function for a p-type FET (PFET) and, particularly, a work function between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). In one exemplary embodiment, the first conformal metal layer can be a titanium nitride (TiN) layer.

In each of the embodiments, the conformal metal layers can further include additional conformal metal layers 273-274, which are above and cover first conformal metal layer 272. Furthermore, the lowermost layer 273 of the additional conformal metal layers can have a portion positioned laterally immediately adjacent to the conformal dielectric layer 271 opposite upper portions of the vertical surfaces of the gate sidewall spacer 261. As discussed above with regard to the method, the additional conformal metal layers 273-274 can be clustered metal layers and, due to a chamfer process, the top ends of the additional conformal metal layers 273-274 can be at about a same height 30, which is greater than the height 10 of the top end of the first conformal metal layer 272, and, thus, essentially co-planar. As illustrated, the top end of the conformal dielectric layer 272 can also be at about this height 30.

The additional conformal metal layers can include, for example, an n-type work function metal layer 273. For purposes of this disclosure, "an n-type work function metal" refers to a metal that has an optimal gate conductor work function for an n-type FET (NFET) and, particularly, a work function between about 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, aluminum carbide, and titanium aluminum carbide. In one exemplary embodiment, this n-type work function metal layer 273 can be a titanium aluminum carbide (TiAlC) layer.

The additional conformal metal layers can further include a barrier metal layer 274 on the n-type work function metal layer 273. The barrier metal layer 274 can be, for example, a titanium nitride layer, a fluorine-free tungsten layer or any other suitable barrier metal layer 274. In one exemplary embodiment, the barrier metal layer 274 can be a titanium nitride (TiN) layer.

Optionally, as illustrated in the embodiment shown in FIGS. 18A-18B, the conformal metal layers can further include a second conformal metal layer 278, which is sandwiched between the first conformal metal layer 272 and the lowermost layer 273 of the additional conformal metal layers. This second conformal metal layer 278 can include a portion between vertical portions of the first conformal metal layer 272 below and the layer 273 above and positioned laterally immediately adjacent to the conformal dielectric layer 271 opposite middle portions of the vertical surfaces of the gate sidewall spacers 261 such that a height 20 of a top end of the second conformal metal layer 278 is between the height 10 of the top end of the first conformal metal layer 272 and the height 30 of the top ends of the additional conformal metal layers 273-274 and the conformal dielectric layer 271. The second conformal metal layer 278 can be another unclustered layer and, like the first conformal metal layer 272, can be a p-type work function metal layer. For example, the second conformal metal layer 278 can be made of the same p-type work function metal as the first conformal metal layer 272. In one exemplary embodiment, this p-type work function metal can be titanium nitride and the second conformal metal layer 278 can be employed to increase the thickness of the p-type work function metal adjacent to the channel region 211 and, thereby to selectively adjust (i.e., tune) the threshold voltage (Vt) of the FET. In any case, deposition of the second conformal metal layer 278 at process step 123 can be unclustered.

The RMG 280, 280' can further include a conductive fill material 275 on the barrier metal layer 274. Narrow portions of the conductive fill material 275 can be positioned laterally between vertical portions of all the conformal metal layers 272-274 (and 278, if applicable) between those gate sidewall spacers 261 that traverse the semiconductor body 210 (see FIGS. 11A and 18A) and/or between the side(s) of the semiconductor body 210 at the channel region 211 and the adjacent gate sidewall spacer(s) 261 that are parallel to the semiconductor body 210 (see FIGS. 11B and 18B). Wider portions of the conductive fill material 275 can be positioned above the narrow portions and specifically between vertical portions of only the additional conformal metal layers above the top end of the first conformal metal layer 272 (see FIGS. 11A and 11B) and, if applicable, above the top end of the second conformal metal layer 278 (see FIGS. 18A-18B). The conductive fill material 275 can be, for example, tungsten, cobalt, aluminum, nickel, copper, doped polysilicon, or any other suitable low resistance conductive fill material. The conductive fill material 275 can be etched back, during processing, such that the height 50 of the conductive fill material 275 is higher than the height 30 of the top ends of the additional conformal metal layers 273-274 discussed above. It should be noted that the height 50 of the conductive fill material 275 will be some predetermined/desired gate height above the level of the top surface of the channel region 211.

Each RMG 280, 280' can further include a dielectric gate cap 276, which covers and is immediately adjacent to the conductive fill material 275 and which further extends laterally onto the top ends of the additional conformal metal layers 273-274. As discussed above with regard to the method embodiments, an etch process that is used to recess/adjust the height 50 of the conductive fill material 275 prior to dielectric gate cap formation can also etch away the conformal dielectric layer 271 from the upper vertical surfaces of the gate sidewall spacers 261 above the level of the height 30 (i.e., above the height of the top ends of the additional conformal metal layers 273-274). Thus, the dielectric gate cap 276 may be immediately adjacent to upper vertical surfaces of the gate sidewall spacer 261. In any case, as mentioned above, the top surface of the ILD material 250, the dielectric gate cap 276 on each RMG 280, 280', the gate sidewall spacers 261 and the dielectric plug caps 249 can be essentially co-planar.

It should further be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A metal gate comprising:
   a conformal dielectric layer immediately adjacent to a channel region of a field effect transistor,
      wherein the field effect transistor comprises source/drain regions, the channel region positioned laterally between the source/drain regions, the metal gate adjacent to the channel region, and gate sidewall spacers between the metal gate and the source/drain regions, and
      wherein the conformal dielectric layer is further positioned laterally immediately adjacent to vertical surfaces of the gate sidewall spacers; and
   multiple conformal metal layers comprising:
      a first conformal metal layer immediately adjacent to the conformal dielectric layer opposite the channel region and further opposite lower portions of the vertical surfaces of the gate sidewall spacers, wherein a top end of the first conformal metal layer is at a height above a level of a top surface of the channel region and further below a level of a top end of the conformal dielectric layer; and additional conformal metal layers above the first conformal metal layer, wherein one of the additional conformal metal layers extends over the top end of the first conformal metal layer and is further positioned laterally immediately adjacent to the conformal dielectric layer opposite upper portions of the vertical surfaces of the gate sidewall spacers, and wherein top ends of the additional conformal metal layers are at a height above the height of the top end of the first conformal metal layer.

2. The metal gate of claim 1, further comprising conductive fill material on the additional conformal metal layers.

3. The metal gate of claim 1,
wherein the conformal dielectric layer comprises a high-K dielectric layer,
wherein the first conformal metal layer comprises a p-type work function metal layer, and
wherein the additional conformal metal layers comprises an n-type work function metal layer and a barrier metal layer on the n-type work function metal layer.

4. The metal gate of claim 3,
wherein the p-type work function metal layer and the barrier metal layer comprise titanium nitride layers, and
wherein the n-type work function metal layer comprises a titanium aluminum carbide layer.

5. The metal gate of claim 1, wherein the multiple conformal metal layers further comprise a second conformal metal layer between the first conformal metal layer and the additional conformal metal layers such that the second conformal metal layer is positioned laterally immediately adjacent to the conformal dielectric layer opposite middle portions of the vertical surfaces of the gate sidewall spacers and further such that a height of a top end of the second conformal metal layer is between the height of the top end of the first conformal metal layer and the height of the top ends of the additional conformal metal layers.

6. The metal gate of claim 5, wherein the first conformal metal layer and the second conformal metal layer comprise a same p-type work function metal.

7. The metal gate of claim 1, wherein a top end of the conformal dielectric layer is at approximately a same level as the top ends of the additional conformal metal layers.

8. A metal gate comprising:
a conformal dielectric layer immediately adjacent to a channel region of a field effect transistor,
wherein the field effect transistor comprises source/drain regions, the channel region positioned laterally between the source/drain regions, the metal gate adjacent to the channel region, and gate sidewall spacers between the metal gate and the source/drain regions, and
wherein the conformal dielectric layer is further positioned laterally immediately adjacent to vertical surfaces of the gate sidewall spacers; and
multiple conformal metal layers comprising:
a first conformal metal layer immediately adjacent to the conformal dielectric layer opposite the channel region and further opposite lower portions of the vertical surfaces of the gate sidewall spacers, wherein a top end of the first conformal metal layer is at a height above a level of a top surface of the channel region; and
additional conformal metal layers above the first conformal metal layer and further positioned laterally immediately adjacent to the conformal dielectric layer opposite upper portions of the vertical surfaces of the gate sidewall spacers, wherein top ends of the additional conformal metal layers are at a height above the height of the top end of the first conformal metal layer, and wherein the multiple conformal metal layers further comprise a second conformal metal layer between the first conformal metal layer and the additional conformal metal layers such that the second conformal metal layer is positioned laterally immediately adjacent to the conformal dielectric layer opposite middle portions of the vertical surfaces of the gate sidewall spacers and further such that a height of a top end of the second conformal metal layer is between the height of the top end of the first conformal metal layer and the height of the top ends of the additional conformal metal layers.

9. The metal gate of claim 8, further comprising conductive fill material on the additional conformal metal layers.

10. The metal gate of claim 8,
wherein the conformal dielectric layer comprises a high-K dielectric layer,
wherein the first conformal metal layer comprises a p-type work function metal layer, and
wherein the additional conformal metal layers comprises an n-type work function metal layer and a barrier metal layer on the n-type work function metal layer.

11. The metal gate of claim 10,
wherein the p-type work function metal layer and the barrier metal layer comprise titanium nitride layers, and
wherein the n-type work function metal layer comprises a titanium aluminum carbide layer.

12. The metal gate of claim 8, wherein the first conformal metal layer and the second conformal metal layer comprise a same p-type work function metal.

13. The metal gate of claim 8, wherein a top end of the conformal dielectric layer is at approximately a same level as the top ends of the additional conformal metal layers.

14. A metal gate comprising:
a conformal dielectric layer immediately adjacent to a channel region of a field effect transistor,
wherein the field effect transistor comprises source/drain regions, the channel region positioned laterally between the source/drain regions, the metal gate adjacent to the channel region, and gate sidewall spacers between the metal gate and the source/drain regions, and
wherein the conformal dielectric layer is further positioned laterally immediately adjacent to vertical surfaces of the gate sidewall spacers; and
multiple conformal metal layers comprising:
a first conformal metal layer immediately adjacent to the conformal dielectric layer opposite the channel region and further opposite lower portions of the vertical surfaces of the gate sidewall spacers, wherein a top end of the first conformal metal layer is at a height above a level of a top surface of the channel region and further below a level of a top end of the conformal dielectric layer; and
additional conformal metal layers above the first conformal metal layer, wherein one of the additional conformal metal layers extends over and is immediately adjacent to the top end of the first conformal metal layer and is further positioned laterally immediately adjacent to the conformal dielectric layer opposite upper portions of the vertical surfaces of the gate sidewall spacers, and wherein top ends of the additional conformal metal layers are approximately level with the top end of the first conformal metal layer.

15. The metal gate of claim 14, further comprising conductive fill material on the additional conformal metal layers.

16. The metal gate of claim 14,
wherein the conformal dielectric layer comprises a high-K dielectric layer,
wherein the first conformal metal layer comprises a p-type work function metal layer, and
wherein the additional conformal metal layers comprises an n-type work function metal layer and a barrier metal layer on the n-type work function metal layer.

17. The metal gate of claim 16,
wherein the p-type work function metal layer and the barrier metal layer comprise titanium nitride layers, and
wherein the n-type work function metal layer comprises a titanium aluminum carbide layer.

* * * * *